United States Patent [19]
Mametani et al.

[11] Patent Number: 5,478,759
[45] Date of Patent: Dec. 26, 1995

[54] METHOD OF MANUFACTURING SEMICONDUCTOR DEVICE WITH RETROGRADE WELLS

[75] Inventors: Tomoharu Mametani; Masahiro Shimizu; Katsuhiro Tsukamoto; Hajime Arai; Heiji Kobayashi, all of Hyogo, Japan

[73] Assignee: Mitsubishi Denki Kabushiki Kaisha, Tokyo, Japan

[21] Appl. No.: 156,748

[22] Filed: Nov. 24, 1993

[30] Foreign Application Priority Data

Nov. 26, 1992 [JP] Japan .................................. 4-317110

[51] Int. Cl.$^6$ .................................................. H01L 21/266
[52] U.S. Cl. ........................ 437/30; 437/70; 437/154; 437/931
[58] Field of Search ...................... 437/29, 30, 34, 437/70, 153, 154, 931, 958; 148/DIG. 35, DIG. 70, DIG. 145, DIG. 157

[56] References Cited

U.S. PATENT DOCUMENTS

| | | | |
|---|---|---|---|
| 4,633,289 | 12/1986 | Chen | 257/375 |
| 4,732,869 | 3/1988 | van Attekum et al. | 437/34 |
| 5,004,701 | 4/1991 | Motokawa | 437/70 |
| 5,061,654 | 10/1991 | Shimizu et al. | 437/70 |
| 5,138,420 | 8/1993 | Komori et al. | 257/371 |
| 5,160,996 | 11/1992 | Odanaka | 257/375 |
| 5,292,671 | 3/1994 | Odanaka | 437/154 |

FOREIGN PATENT DOCUMENTS

| | | |
|---|---|---|
| 60-101946 | 6/1985 | Japan . |
| 64-9638 | 1/1989 | Japan . |
| 1-244635 | 9/1989 | Japan . |

OTHER PUBLICATIONS

Ghandhi, S. K., "VLSI Fabrication Principles—Silicon and Gallium Arsenide", 1983, pp. 348–352, 422–423.
John Yuan–Tai Chen: Quadruple–Well CMOS for VLSI Technology; US period.: IEEE Transactions on Electron Devices, vol. ED–31, No. 7, Jul. 1984, pp. 910 to 919.
Odanaka, S., Yabu, T., Shimizu, N. et al.: A Self–Aligned Retrograde Twin–Well Structure with Buried $p^+$–Layer, US period.: IEEE Electron Device Letters, vol. 10, No. 6, Jun. 1989, pp. 280 to 282.
Hans P. Zappe, et al., "Characteristics of CMOS Devices in High–Energy Boron–Implanted Substrates", IEEE Transactions on Electron Devices, vol. 35, No. 7 (Jul. 1988), pp. 1029–1934.
Tomoshisa Mizuno, et al., "Oxidation Rate Reduction in the Submicrometer LOCOS Process", IEEE Transactions on Electron Devices, vol. ED–34, No. 11 (Nov. 1987), pp. 2255–2259.
Maruzen Kbushiki Kaisha, "Electric Material Series Sub-micron Device I", pp. 4–8. (no date).

*Primary Examiner*—Chandra Chaudhari
*Attorney, Agent, or Firm*—Lowe, Price, LeBlanc & Becker

[57] ABSTRACT

A thick isolation oxide film is selectively formed on a surface of a silicon substrate so as to isolate an element formation region. Ions are implanted into a region in silicon substrate through the thick isolation oxide film. Thus, retrograde wells, having impurity concentration peak positions are formed in the region of silicon substrate positioned under the isolation oxide film. Then, an upper part of the isolation oxide film is removed away to form an isolation oxide film with a reduced thickness. Isolation oxide film has a reduced isolation length L. Thus, a semiconductor device is provided, which permits restriction of the narrow channel effect and the substrate biasing effect when the size of elements is reduced.

39 Claims, 38 Drawing Sheets

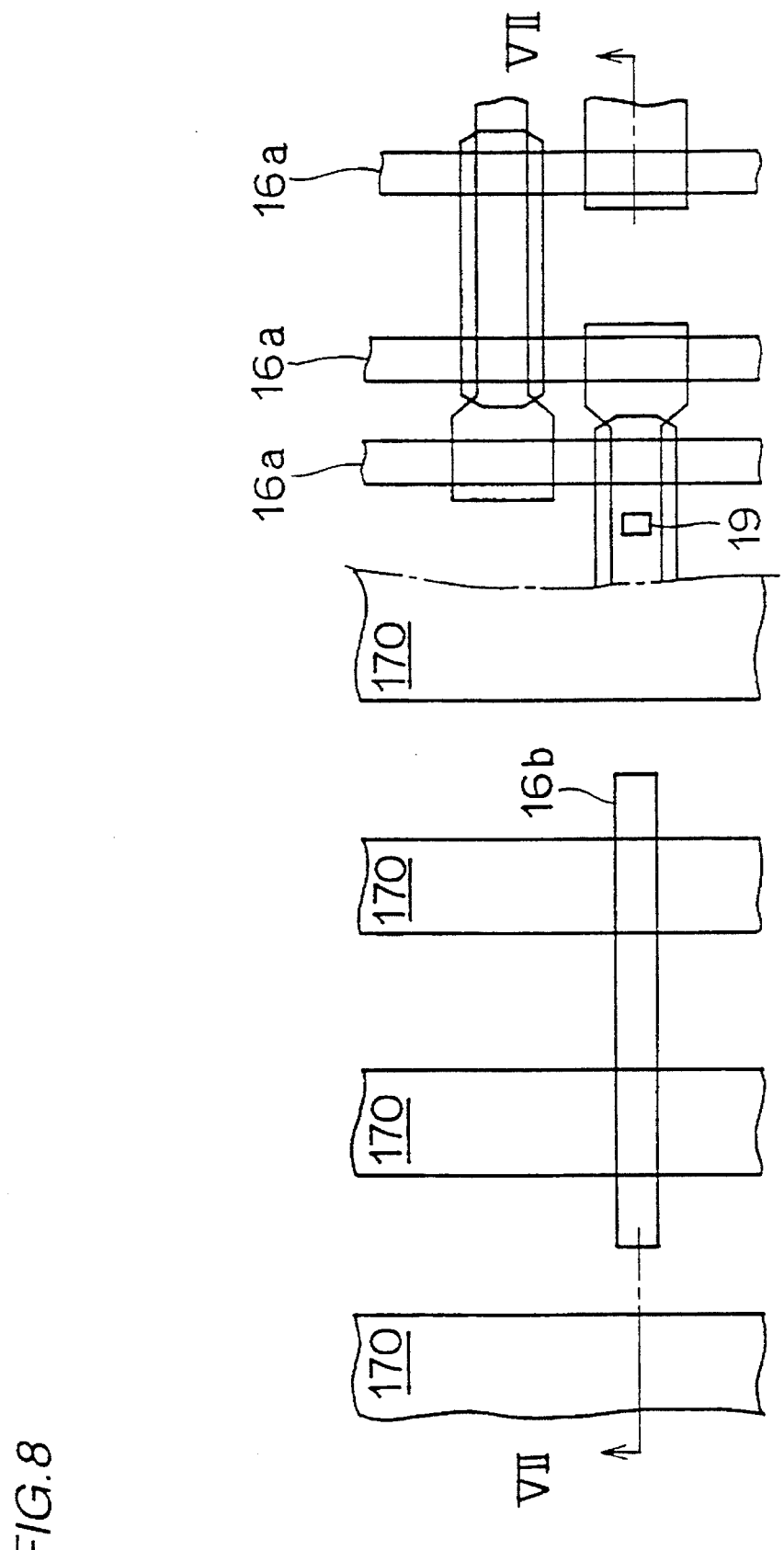

5,478,759

METHOD OF MANUFACTURING SEMICONDUCTOR DEVICE WITH RETROGRADE WELLS

BACKGROUND OF THE INVENTION

1. Field of the Invention

The present invention relates generally to methods of manufacturing semiconductor devices, and more specifically, to a method of forming a well region having a prescribed impurity concentration distribution in a region positioned under an isolation insulating film.

2. Description Of The Background Art

A typical example of a semiconductor device having MOS transistors formed on a main surface of wells formed on a semiconductor substrate is a complementary MOS device (hereinafter referred to as CMOS device). A CMOS device is characterized in that an n channel MOS transistor and a p channel MOS transistor are formed in a single semiconductor substrate. The power consumption of a CMOS device is advantageously very small, because DC current flowing between power supply terminals is very small. Now, the structure of a conventional CMOS device will be described as the background of the invention in conjunction with the drawings.

FIG. 43 is partly sectional view showing the structure of a conventional CMOS device. An n well 5 and a p well 6 having different conductivity types from each other are formed in a surface region of a p type silicon substrate 1. An isolation oxide film (field oxide film) 2 for element isolation is formed in a prescribed region on surfaces of n well 5 and p well 6. A p channel MOS transistor 50 is formed on a surface of n well 5. An n channel MOS transistor 60 is formed on a surface of p well 6. P channel MOS transistor 50 has a gate electrode 8, and a pair of p$^+$ impurity regions 9a, 9b spaced apart from each other. N channel MOS transistor 60 has a gate electrode 8, and a pair of n$^+$ impurity regions 10a, 10b spaced apart from each other. Note that although only one transistor is depicted in each of n well 5 and p well 6 in FIG. 43, a plurality of MOS transistors and other functional elements are formed in practice.

The CMOS structure is however susceptible to a latch up phenomenon in which excessive current flows across power supply terminals to break down elements. The latch up herein indicates a phenomenon in which pnp and npn parasitic bipolar transistors are formed in a CMOS device to constitute a pnp thyristor between power supply potential ($V_{DD}$) and ground potential GND ($V_{SS}$), and therefore current continues to flow between $V_{DD}$ and GND once extraneous noise is applied, resulting in breakdown.

FIG. 44 is a cross sectional view schematically showing a parasitic thyristor formed in a CMOS device the same as one described in conjunction with FIG. 43. In FIG. 44, if the impurity concentrations of n well 5 and p well 6 are low, voltage drop down (voltage drop down corresponding to resistors Rn, Rp) increases when some surge is applied and current flows across these well regions. Thus, the emitter-base regions of parasitic pnp bipolar transistor Q1 and parasitic npn bipolar transistor Q2 are biased. As a result, these parasitic transistors operate and the latch up phenomenon described above is likely to occur.

A so-called retrograde well structure with an increased impurity concentration at the bottom of well is employed for the purpose of improving the resistance against the latch up phenomenon. The retrograde well is usually formed by implanting impurity ions with high energy into a semiconductor substrate.

A method of forming a retrograde well by means of implanting impurity ions with a high energy into a semiconductor substrate is, for example, disclosed in John Yuan-Tai Chen, "Quadruple-Well CMOS for VLSI Technology," IEEE Transactions on Electron Devices, vol. ED-31, No. 7, July 1984 and U.S. Pat. No. 4,633,289. FIGS. 45–49 are cross sectional views showing steps in the manufacture of a conventional retrograde well structure.

Referring to FIG. 45, a thick isolation oxide film 22 is selectively formed on a surface of a p type silicon substrate 1 so as to separate element formation regions. Isolation oxide film 22 is formed by means of LOCOS (Local Oxidation of Silicon). The LOCOS is a process of thermally oxidizing an underlying oxide film 3 having only a prescribed surface region exposed by a patterned nitride film. The formation of isolation oxide film 22 defines an active region in which MOS transistor and the like are to be formed. Underlying oxide film 3 is formed on the element formation region.

Then, as illustrated in FIG. 46, a region to form the p well is covered with patterned resist 41. Using patterned resist 41 as mask, phosphorus ions (P$^+$) are implanted with high energy into silicon substrate 1 a number of times, changing the energy and the implantation amount. Thus, n type retrograde wells 51, are formed to have a first n type concentration peak position 51a at a deep position in silicon substrate 1 and a second n type impurity concentration peak position 51b under isolation oxide film 22. At the time, low energy ion implantation is not performed to prevent increase of the impurity concentration of the n type well in a shallow region up to about 1000 Å in depth from the surface of silicon substrate 1.

As illustrated in FIG. 47, after removal of patterned resist 41, the n well region is covered with patterned resist 42. Using patterned resist 42 as mask, boron ions (B$^+$) as p type impurity ions are implanted with high energy a number of times into silicon substrate 1, changing the energy and the implantation amount. Thus, p type retrograde wells 61, are formed to have a first p type impurity concentration peak position 61a at a deep position in silicon substrate 1, and a second p type impurity concentration peak position 61b under isolation oxide film 22. As in the above case, low energy ion implantation is not performed to prevent increase of the impurity concentration of the p type well in the vicinity of the surface of silicon substrate 1. Thereafter, as illustrated in FIG. 48, patterned resist 42 is removed away.

Finally as illustrated in FIG. 49, after removal of underlying oxide film 3, a gate oxide film 7 is formed again in the same region. Gate electrode 8 is formed on gate oxide film 7. A pair of p$^+$ impurity regions 9a, 9b are formed spaced apart from each other with gate electrode 8 therebetween in n type retrograde well region 51. A pair of n$^+$ impurity regions 10a, 10b are formed spaced apart from each other with gate electrode 8 therebetween in p type retrograde well region 61. Thus, a p channel MOS transistor 50 is formed in n type retrograde well region 51, while n channel MOS transistor 60 is formed in p type retrograde well region 61.

In the retrograde well regions thus formed, the region having first impurity concentration peak positions 51a, 61a formed at the deep positions of silicon substrate 1 is effective in preventing the latch up phenomenon. The region having second impurity concentration peak positions 51b, 61b functions as a channel stop region for element isolation.

As the size of elements such as a MOS transistor formed in a semiconductor substrate is reduced, the thickness of an isolation oxide film is reduced. More specifically, as the element isolation width is reduced from the order of micron to the order of submicron, the thickness of the isolation oxide film is reduced from about 5000 Å to about 3000 Å.

The reason for the thickness of the isolation oxide film being reduced will be described. As the size of elements such as MOS transistor is reduced, the element isolation width should be reduced. More specifically, the element isolation width should be reduced to the order of submicron less than 1 µm and further less than 0.5 µm. In order to achieve such an element isolation width, a field oxidation treatment must be performed after patterning a nitride film to have an opening width less than 1 m.

Now, the relation between the thicknesses of isolation oxide films and the opening widths of nitride films when each isolation oxide film is formed under the same conditions will be described. The relation between the thickness of isolation oxide film and the opening width of nitride film under the same treatment conditions is disclosed in "Oxidation Rate Reduction in the Submicrometer LOCOS Process", IEEE TRANSACTIONS, Vol. ED-34, No. 11, Nov. pp. 2255-2259 1987.

According to this document, when a field oxidation treatment was performed using a nitride film having an opening width less than 1 µm, it was demonstrated the thickness of the isolation oxide film was reduced as the opening width was reduced. This means that the thickness of the isolation oxide film is reduced as the element isolation width is reduced under the same oxidation treatment conditions. However, even in the case of a nitride film having a small opening width, the thickness of an isolation oxide film can be increased by prolonging time for treatment. Thus prolonging the time for treatment is however disadvantageous in view of reducing size, because bird's beaks are increased accordingly. In view of the foregoing, it is pointed that thickness of the isolation oxide film is reduced as the element isolation width is reduced.

FIG. 50 is a cross sectional view showing the state of the retrograde well structure shown in FIG. 49 in which the isolation oxide film is reduced. As illustrated in FIG. 50, isolation oxide film 23 is reduced in thickness as compared to isolation oxide film 22 in FIG. 49. Accordingly, second impurity concentration peak positions 51b, 61b forming the retrograde wells are formed at the positions closer to the surface of silicon substrate 1. This is because impurity ions are implanted into silicon substrate 1 through thin isolation oxide film 23, and second impurity concentration peak positions 51b, 61b formed as a channel stop region for element isolation are formed at the positions closer to the surface of silicon substrate 1. As a result, the impurity is diffused by thermal treatment, etc. in succeeding steps and is likely to reach the vicinity of the surface of silicon substrate 1. This adversely affects the transistor characteristics, especially substrate biasing effect on the surface of silicon substrate 1.

The substrate biasing effect herein indicates the effect in which the threshold voltage of an MOS transistor is changed by applying voltage to the silicon substrate in which the MOS transistor is formed. More specifically, the threshold voltage is proportional to the square root of the substrate bias voltage. The constant of proportion is defined as a substrate effect constant. The adverse effect upon the above-described substrate biasing effect indicates increase of the substrate effect constant.

FIG. 51 is a graph showing the relation between threshold voltage $V_{th}$ and substrate bias voltage $V_{BS}$. When the thickness of an isolation oxide film is 5000 Å and an impurity concentration peak position is present under the isolation oxide film, as illustrated in FIG. 51, the substrate effect constant K will be 0.2. In this case, even if substrate bias voltage $V_{BS}$ changes from 0 V to −5 V, the degree of change of threshold voltage Vth is relatively small. If, however, thickness of the isolation oxide film is reduced to about 2000 Å as reduction of the size of elements proceeds and a retrograde well is formed to have an impurity concentration peak position under the isolation oxide film, an impurity is implanted to a shallow position from the substrate surface. Accordingly, the impurity diffuses due to thermal treatment in subsequent steps, resulting in increase of the impurity concentration in the vicinity of the substrate surface. As a result, the substrate effect constant K becomes as large as 0.5. Thus, slight change of a substrate bias voltage $V_{BS}$ results in great change of threshold voltage $V_{th}$.

In this case, a bias voltage imposed state is encountered due to extraneous noise, even if bias voltage is not applied to the substrate. Therefore in a CMOS device having a retrograde well structure, when the isolation oxide film is reduced in thickness with reduction of the size of transistors, the threshold voltage of an MOS transistor is likely to change if bias voltage is supplied to the substrate or a bias voltage imposed state is attained due to some extraneous causes. Thus, as the thickness of the isolation oxide film is reduced, the impurity performing the retrograde well structure adversely affects the characteristic of the MOS transistors formed on the substrate surface.

A disadvantage encountered when a retrograde well structure is formed in a shallow portion of the above-described element formation region will be described in more detail in conjunction with FIGS. 52–55. These FIGS. 52–54 are cross sectional views showing manufacturing steps especially in view of the retrograde well structure. FIG. 55 is a view for use in illustration of how the substrate biasing effect is influenced when a retrograde well structure is formed in a relatively shallow portion in an element formation region.

Referring to FIG. 52, an isolation oxide film 102 is selectively formed in a main surface of p type semiconductor substrate 101. A first impurity concentration peak position 105a is formed by implanting impurity ion with a high energy through isolation oxide film 102. Then, referring to FIG. 53, an impurity is implanted into a second impurity concentration peak position 105b by implanting the impurity with energy the same as impurity implantation in the vicinity of the bottom surface of isolation oxide film 102. After the impurity is thus implanted, a prescribed thermal treatment is performed to form a second impurity concentration peak position 105b extending from the vicinity of the bottom surface of isolation oxide film 102 to the bottom of element formation region.

Since second impurity concentration peak position 105b is thus formed, the depth D of second impurity concentration peak position 105b under the element formation region is determined by the thickness t3 of isolation oxide film 102. More specifically, if the thickness t3 of isolation oxide film 102 takes a small value, second impurity concentration peak position 105b will be formed at a relatively shallow position in the element formation region. As a result, the substrate biasing effect in the element formation region is increased.

The reason for the increase of the substrate biasing effect by the formation of the second impurity concentration peak position at such a shallow position from the semiconductor substrate surface will be described. The threshold voltage Vth of a transistor is given by the following equation in Mitsumasa Koyanagi, *Electronic Material Series Submicron Device I*, MARUZEN KABUSHIKI KAISHA, pp. 4–8.

$$V_{th} = V_{FB} + 2\Phi_F - Q_{B0}/C_{OX}$$
$$= V_{FB} + 2\Phi_F(2 \times \epsilon_S \times \epsilon_0 \times q \times N_A)^{1/2} \times (V_{BS} + 2\Phi_F)^{1/2}/C_{OX}$$

where $V_{FB}$ represents flat band voltage, $\Phi_F$ Fermi potential of substrate, $V_{BS}$ substrate bias voltage, and $C_{OX}$ oxide film capacitance. In the above equation, $(2 \cdot \epsilon_S \cdot \epsilon_0 \cdot q \cdot N_A)^{1/2}/C_{OX}$ is a coefficient called substrate effect constant. The substrate effect constant (K) is a coefficient representing the degree of modulation of $V_{th}$ by the substrate biasing. The dependence of the substrate biasing effect upon the impurity concentration of the substrate is due to acceptor concentration $N_A$ included in the above-described substrate effect constant. More specifically, increase of acceptor concentration $N_A$ in the region in which an inversion layer and a depletion layer are formed increases the value of threshold voltage $V_{th}$.

FIG. 55 shows an MOS transistor having a conventional retrograde well structure. Referring to FIG. 55, a source region 114 and a drain region 113 are formed to define a channel region in an element formation region. A gate electrode 111 is formed on the channel region with a gate insulating film 112 therebetween. Voltage $V_D$ is applied to the drain region of the MOS transistor, and voltage $V_G$ is applied to gate electrode 111. Source region 113 is grounded.

Supplying prescribed voltages to drain region 113 and gate electrode 111 forms a depletion layer 110. In the vicinity of the region in which depletion layer 110 is formed, however, as illustrated in FIG. 55, the second impurity concentration peak position 105b of retrograde well structure 105 will be formed. This restricts depletion layer 110 from expanding, and as illustrated in FIG. 55, for example, the depletion region will be formed into a narrow depletion layer 110a. Thus, the depletion layer capacitance is increased, whereby the substrate biasing effect is increased accordingly.

More specifically, the formation of the impurity concentration peak position at a shallow position in the element formation region increases the accepter concentration in the vicinity of the region to form the depletion layer, thus increasing the substrate effect constant. The substrate effect constant takes the value of K shown in FIG. 51, and as the value of the substrate effect constant is larger, change of the threshold voltage $V_{th}$ is increased by supplying the substrate bias voltage. More specifically, the substrate biasing effect is increased.

Meanwhile, one method of forming a channel cut layer under an isolation oxide film is to previously implant an impurity for forming the channel cut layer into the isolation oxide film formation region and then to form the isolation oxide film. According to this method, the problem associated with the substrate biasing effect described above can be alleviated, but the problem of narrow channel effect is encountered. This will be described in conjunction with FIGS. 56–62. FIGS. 56–60 are cross sectional views showing manufacturing steps for forming an element isolation structure by which a channel cut layer is previously implanted with an impurity, and then an isolation oxide film is formed.

Referring to FIG. 56, an impurity is implanted to form a well in a p type semiconductor substrate 101, and a first impurity concentration peak 105a is formed at a deep position in p type silicon substrate 101. Then, an oxide film 102a and a nitride film 103 are sequentially formed on a surface of p type silicon substrate 101. As illustrated in FIG. 57, resist 106 which is patterned into a prescribed form is formed on nitride film 103, and nitride film 103 is patterned into a prescribed form using resist 106 as mask.

Referring to FIG. 58, an impurity 104a is implanted to form a channel cut layer using the above-described resist 106 as mask. Then, referring to FIG. 59, after removal of resist 106, an isolation oxide film 102 is selectively formed by means of thermal oxidation treatment. Thus, channel cut layer 104 is formed under isolation oxide film 102. Subsequently, as illustrated in FIG. 60, nitride film 103 is removed away.

Now, referring to FIGS. 61 and 62, the problem of the narrow channel effect associated with the above-described structure will be described. FIG. 61 is a cross sectional view showing an MOS transistor having the above-described element isolation structure. FIG. 62 is a plan view showing the MOS transistor including the above-described element isolation structure. A cross section taken along line A—A in FIG. 62 corresponds to FIG. 61.

Referring to FIG. 61, an element formation region 109 is defined by isolation oxide film 102. channel cut layer 104 is formed to extend to the vicinity of the surface of element formation region 109. In this case, a substantial element formation region width W2 is smaller than a desired element formation region width W3 by the function of channel cut layer 104. More specifically, channel cut layer 104 is formed to enter element formation region 109 by the width of 2S, and the width of element formation region is reduced by the amount. The narrow channel effect is thus enhanced. When viewed two-dimensionally, this is as illustrated in FIG. 62. More specifically, channel cut layer 104 is formed around element formation region 109 to stick out from isolation oxide film 102. This narrows the substantial width of element formation region 109. The narrow channel effect thus become remarkable. In contrast, in the above-described retrograde well structure, the narrow channel effect described above is hardly encountered.

SUMMARY OF THE INVENTION

It is therefore one object of the invention to solve the above-described problem and provide a method of manufacturing a semiconductor device without the adverse effect of a retrograde well structure upon the characteristic of an MOS transistor formed on the surface of the substrate even when the thickness of an isolation insulating film is reduced with reduction of the size of elements.

Another object of the invention is to provide a method of manufacturing a semiconductor device by which the substrate effect constant is kept small and the narrow channel effect can be suppressed.

According to a method of manufacturing a semiconductor device according to the invention, in one aspect, an isolation insulating film having a prescribed thickness to isolate an element formation region is selectively formed on a surface of a semiconductor substrate. Impurity is implanted from the main surface of the semiconductor substrate into a region of the semiconductor substrate through the isolation insulating film. Thus, a well region giving a prescribed impurity concentration distribution is formed in the region of the semiconductor substrate positioned under the isolation insulating film. Thereafter, a surface portion of the isolation insulating film is removed away to reduce the thickness of the isolation insulating film.

According to the invention, in one aspect, after formation of the isolation insulating film, the well region giving a prescribed impurity concentration distribution is formed in the region of the semiconductor substrate positioned under the isolation insulating film. Then, the upper part of the isolation insulating film is removed away to reduce the thickness of the isolation insulating film. Accordingly, after previously forming an isolation insulating film thicker than conventional, a well region giving a prescribed impurity concentration distribution is formed at a deep position from the surface of the substrate by introducing impurity into a region of the semiconductor substrate through the isolation insulating film. The substrate biasing effect is thus suppressed.

Further, after forming the well region giving a prescribed impurity concentration distribution under the isolation insulating film, a surface portion of the isolation insulating film is removed away. This reduces the thickness of the isolation insulating film, and the part extending transversely of the isolation insulating film is removed away as well. Accordingly, a semiconductor device having a retrograde well structure suitable for reducing the size of elements can be provided.

By a method of manufacturing a semiconductor device according to the invention, in another aspect, an isolation insulating film having a prescribed thickness to isolate an element formation region is selectively formed on a main surface of a semiconductor substrate. Then, a mask layer for exposure of the surface of the isolation oxide film is formed. Impurity is introduced through the exposed isolation insulating film to form a first impurity region within the region of the semiconductor substrate close to the isolation insulating film. A second impurity region is formed in the region further away from the surface of the semiconductor substrate than the first impurity region.

According to the invention, in this aspect, a mask layer for exposure of a surface of the isolation insulating film is formed and impurity is introduced into the region under the isolation insulating film using the mask layer to form the first impurity region in the region within the semiconductor substrate close to the isolation insulating film. Thus, the first impurity region is formed only under the isolation insulating film and will not extend toward the element formation region. The narrow channel effect is thus suppressed. Further, after thus forming the first impurity region, the second impurity region is formed in the region further away from the surface of the semiconductor substrate than the first impurity region. At the time, appropriately selecting conditions for formation of the second impurity region, the region may be formed under the element formation region and away from the surface of the semiconductor substrate. Thus, the substrate effect constant in the element formation region can be kept small and the substrate biasing effect can be suppressed as well.

By a method of manufacturing a semiconductor device according to the invention, in a still further aspect, an element isolation layer to isolate an element formation region is selectively formed on a main surface of a semiconductor substrate. Then, a mask layer for exposure of a surface of the element formation region is formed on the element isolation layer. Impurity is introduced through the mask layer and the element isolation layer to form an impurity region extending from a first region within the semiconductor substrate close to the element isolation layer to a second region further away from the surface of the semiconductor substrate than the first region. The mask layer preferably constitutes a part of the element isolation layer. The element isolation layer is preferably an isolation insulating film. The element isolation layer preferably includes a stacked structure formed of an insulating layer formed on the semiconductor substrate and a conductive layer formed thereon.

According to the invention, in this aspect, the mask layer for exposure of a surface of the element formation region is formed on the element isolation layer, and impurity is introduced through the mask layer and the element isolation layer to form an impurity region extending from the first region within the semiconductor substrate close to the element isolation layer to the second region further away from the surface of the semiconductor substrate than the first region. At the time, the impurity is implanted through the mask layer and the element isolation layer, and the impurity is implanted into the region positioned under the element formation region as well. Thus, the second region extending from the first region positioned under the element isolation layer to a deep position under the element formation region and away from the surface of the semiconductor substrate may be formed. This suppresses the narrow channel effect and a semiconductor device with a substrate biasing effect suppressed can be provided. Appropriately adjusting the thickness of the mask layer permits formation of the second region at a depth suitable for each device. Therefore, the degrees. of the narrow channel effect and the substrate biasing effect can be suppressed for various kinds of devices.

By a method of manufacturing a semiconductor device according to the invention, in a still further aspect, impurity is selectively introduced into a first region within the element formation region of a semiconductor substrate. An isolation insulating film having a prescribed thickness is formed on a main surface of the semiconductor substrate in a second region including and surrounding the first region within the element isolation region, whereby a first impurity region is formed in the first region. Then, a second impurity region is formed in the region further away from the surface of the semiconductor substrate than the first impurity region.

According to the invention, in this aspect, the impurity is selectively introduced into the first region in the element formation region, and the isolation insulating film having a prescribed thickness is formed in the second region including and surrounding the first region. At the time, appropriately selecting formation conditions for this isolation insulating film can precludes the impurity introduced into the first region from diffusing into the element formation region. Thus, the narrow channel effect can be suppressed. The second impurity region is formed in the region further away from the surface of the semiconductor substrate than the first impurity region. At the time, appropriately selecting formation conditions for the second impurity region permits the second impurity region to be formed at a deep position in the semiconductor substrate under the element formation region. Thus, the substrate biasing effect can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a partial plan view showing the two-dimensional arrangement of the DRAM corresponding to the cross section of FIG. 7 at (C);

DESCRIPTION OF THE PREFERRED EMBODIMENTS

Now, embodiments of the invention will be described. FIGS. 1–6 are partial cross sectional views showing the structure of a semiconductor device in steps in a method of manufacturing the semiconductor device according to the first embodiment of the invention.

Figure 1:
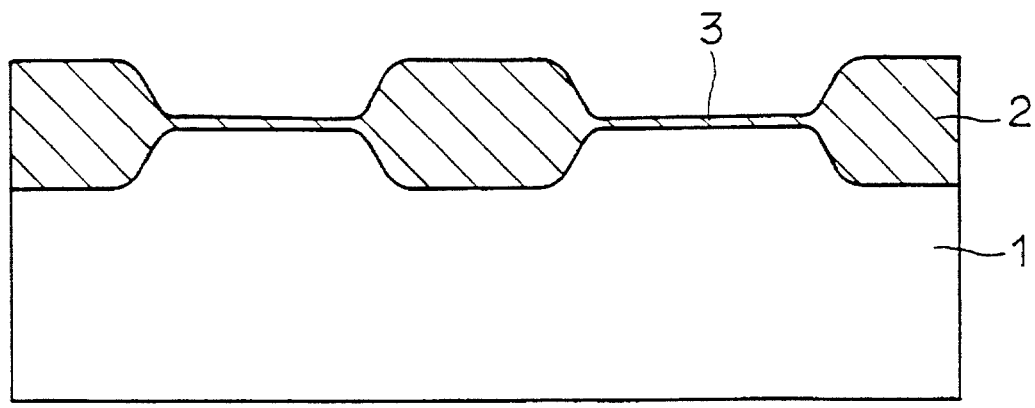
FIGS. 1–6 are partially cross sectional views showing 1st–6th steps in a method of manufacturing a semiconductor device according to a first embodiment of the invention.

Referring to FIG. 1, an isolation oxide film 2 having a thickness of about 8000 Å is selectively formed to isolate an element formation region. The formation of isolation oxide film 2 defines an active region to form elements such as MOS transistor in subsequent steps. An underlying oxide film 3 is formed on the active region.

Figure 2:
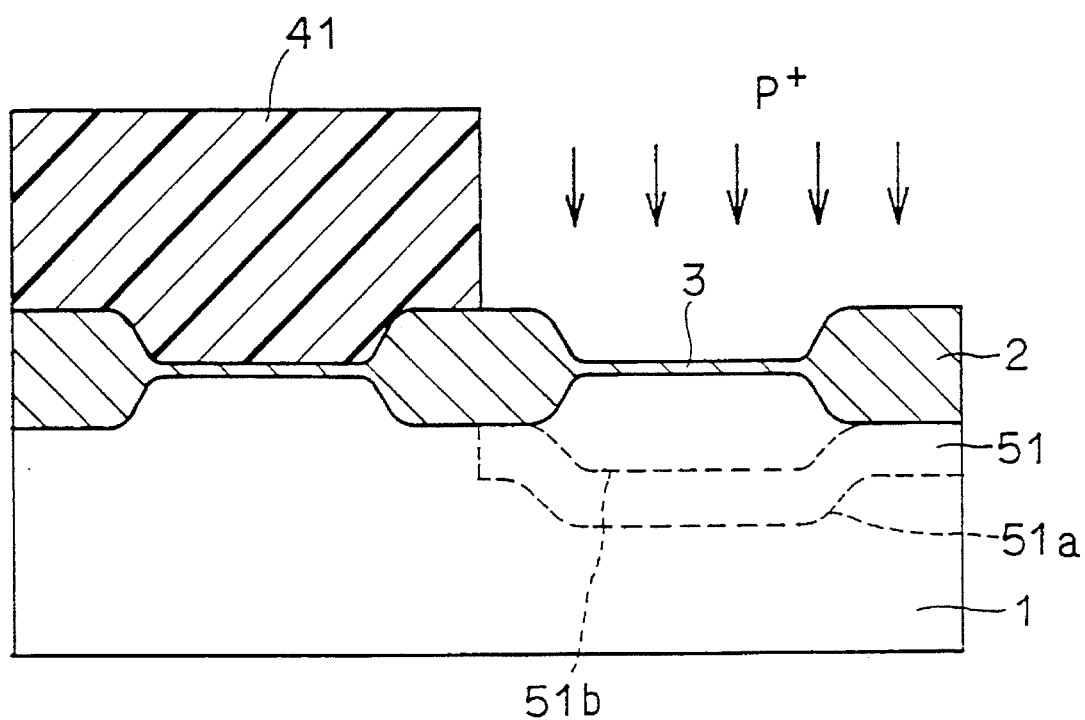

As illustrated in FIG. 2, the surface of the region to form a p well is covered with patterned resist 41. Phosphorus ions ($P^+$) as n type impurity ions are introduced into a silicon substrate 1 in the region to form an n well, using patterned resist 41 as mask. This ion implantation is achieved by two ion implantation steps for forming a retrograde well. For the first ion implantation, phosphorus ions are implanted into a deep position of silicon substrate 1 with an implantation energy in the range from 1.0 to 1.5 MeV, in a dose amount in the range from $1.0 \times 10^{13}$ to $1.0 \times 10^{14}$ cm$^{-2}$. This is performed to form a first n type impurity concentration peak position 51a (whose impurity concentration is up to about $10^{18}$ cm$^{-3}$) for preventing latch up. Then, the second ion implantation is performed with an implantation energy in the range from 350 to 500 keV in a dose amount in the range from $1.0 \times 10^{12}$ to $1.0 \times 10^{13}$ cm$^{-2}$. This implantation forms a second n type impurity concentration peak position 51b (whose impurity concentration is up to about $10^{17}$ cm$^3$) is formed as a channel stopper under the isolation oxide film 2. An n type retrograde well 51 is thus formed.

Figure 3:
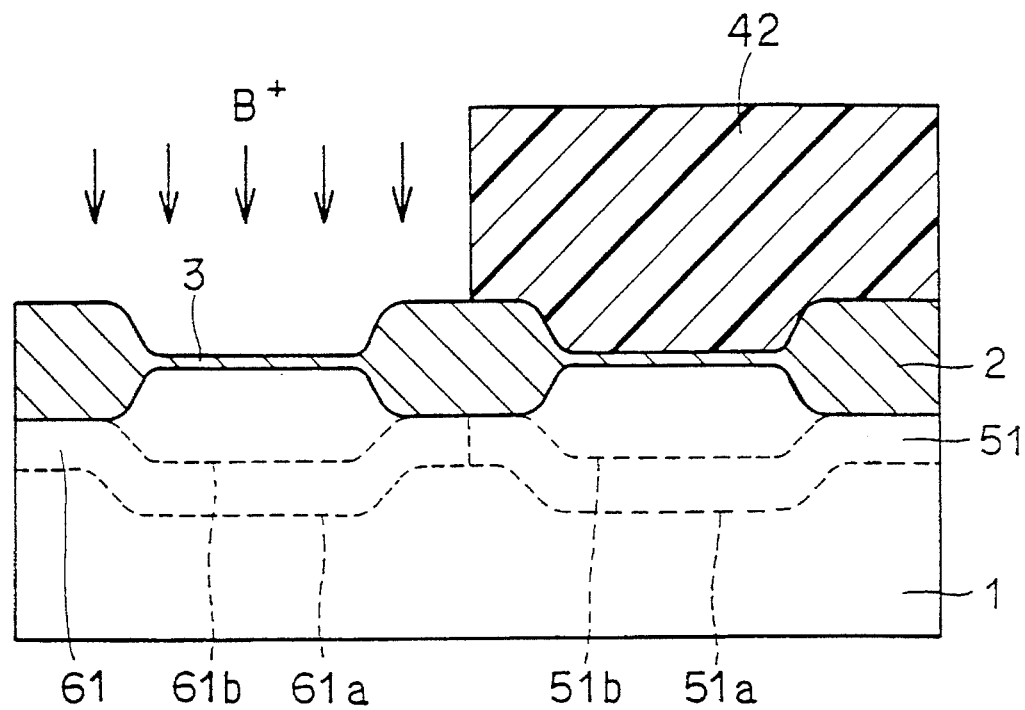

Now, referring to FIG. 3, after removal of patterned resist 41, a surface of n well region is covered with patterned resist 42. Boron ions ($B^+$) are implanted into a deep position of silicon substrate 1 with an implantation energy in the range from 500 to 1000 keV in a dose amount in the range from $1.0 \times 10^{13}$ to $1.0 \times 10^4$ cm$^{-2}$. This is performed to form a p type impurity concentration peak position 61a (whose impurity concentration is up to about $10^{18}$ cm$^{-3}$) for preventing latch up. Then, the second boron ion implantation is performed with an implantation energy in the range from 120 to 200 keV, in a dose amount in the range from $1.0\times10^{12}$ to $1.0\times10^{13}$ cm$^{-2}$. By this implantation a second impurity concentration peak position 61b (whose impurity concentration is up to about $10^{17}$ cm–3) is formed as a channel stopper under isolation oxide film 2. A p type retrograde well 61 is thus formed.

Figure 4:
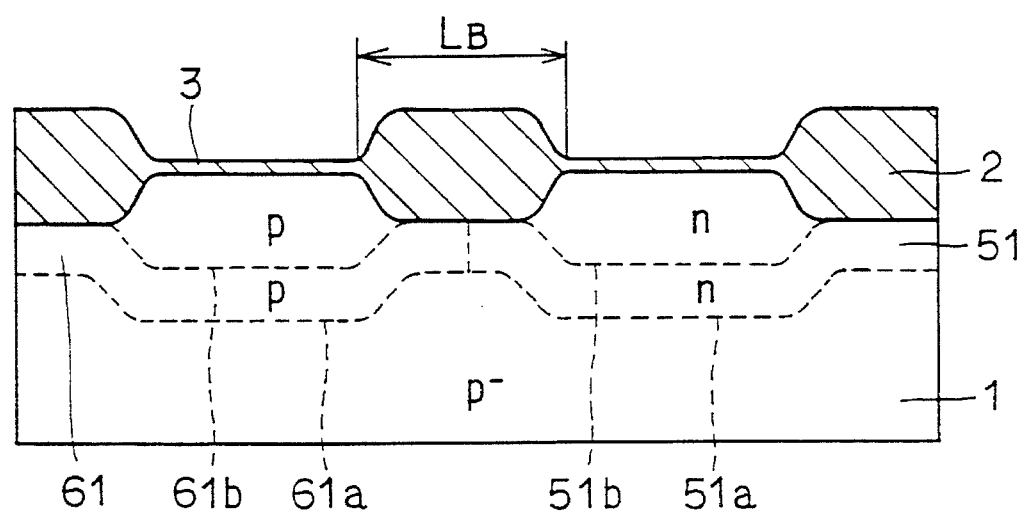

Then, patterned resist 42 is removed away as illustrated in FIG. 4. Since isolation oxide film 2 is formed thick, the retrograde well region is formed at a deep position from the surface of silicon substrate 1. More specifically, impurity concentration peak positions 51b, 61b formed in contact with the bottom surface of isolation oxide film 2 are formed at a deeper position from the surface of the silicon substrate in the element formation region.

Figure 5:
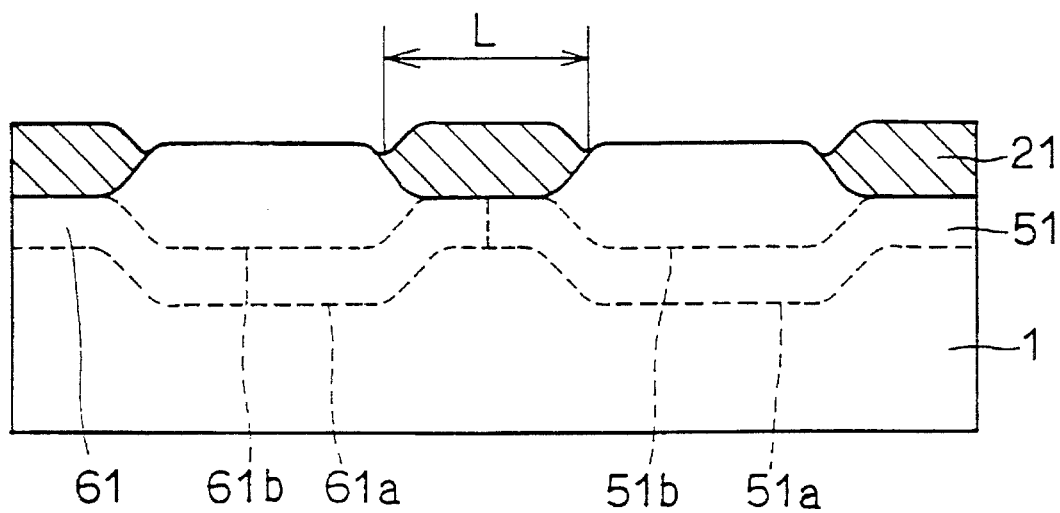

As illustrated in FIG. 5, if the upper part of isolation oxide film 2 is etched away using hydrofluoric acid, for example, to form an isolation oxide film 21 with a reduced thickness. At the time, underlying oxide film 3 is removed away. Thus, isolation oxide film 21 having a thickness of about 3000 Å for example, is formed. Accordingly, the tip portion of bird's beak is removed away as well, and therefore, the isolation length $L_B$ of the initial isolation oxide film 2 is reduced to the isolation length L of isolation oxide film 21 after the etching.

Figure 6:
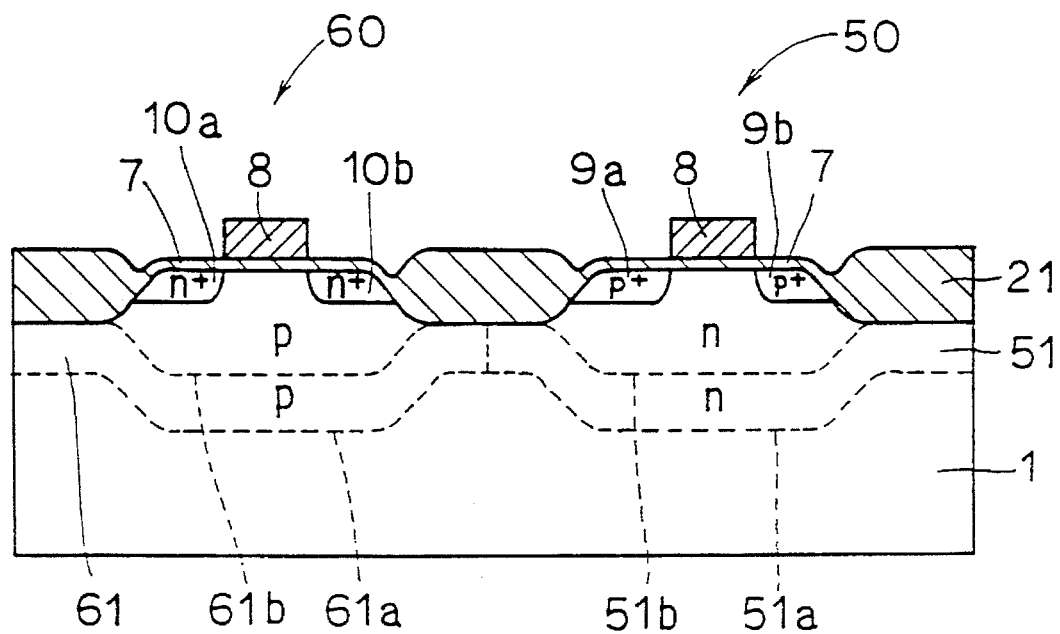

Finally as illustrated in FIG. 6, a gate oxide film 7 is formed on a surface of silicon substrate 1. A gate electrode 8 is selectively formed on gate oxide film 7. A pair of p$^+$ impurity regions 9a, 9b are formed on regions of n type retrograde well 51 spaced apart from each other with gate electrode 8 therebetween. A pair of n$^+$ impurity regions 10a, 10b are formed on regions of p type retrograde well 61 spaced apart from each other with gate electrode 8 therebetween. Thus, a p channel MOS transistor 50 is formed on the region of n type retrograde well 51 and an n channel MOS transistor 60 is formed on the region of p type retrograde well 61.

As described above, the impurity concentration peak position forming a retrograde well is formed under the isolation oxide film by implanting impurity ions with high energy into the silicon substrate through the isolation oxide film formed thicker. Thereafter, the upper part of the isolation oxide film is etched away to reduce the transverse extension of the isolation oxide film. Thus, the element formation region is expanded corresponding to the reduction of the size of elements. As a result, a retrograde well structure suitable for reduction of the size of elements is provided. More specifically, the impurity concentration position constituting the retrograde well is formed at a deep position from the surface of the silicon substrate, and therefore the impurity contained in the region will not reach the vicinity of the surface of the substrate by thermal treatment in subsequent steps. Accordingly, even if bias voltage is applied or bias voltage is imposed upon the substrate by extraneous noise, etc., the threshold voltage of the MOS transistor formed in the retrograde well region will not change greatly. More specifically, the impurity constituting the retrograde well structure will not adversely affect the characteristic of the MOS transistor formed on the substrate surface.

Now, an application of the manufacturing method according to the invention to a DRAM (Dynamic Random Access Memory) will be described. For DRAMs, bird's beaks of an isolation oxide film to isolate memory cells must be suppressed in order to reduce the size of element, especially a memory cell array. A manufacturing method by which an element formation region in a memory cell array is expanded by etching away the upper part of only an isolation oxide film positioned in the memory cell array is disclosed in Japanese Patent Laying-Open No. 64-9638. Applying a method of manufacturing according to the invention to this disclosed manufacturing method eliminates the adverse effect of retrograde well structure upon the characteristics of memory cells and provides a memory cell structure of a reduced size.

Figure 7A:
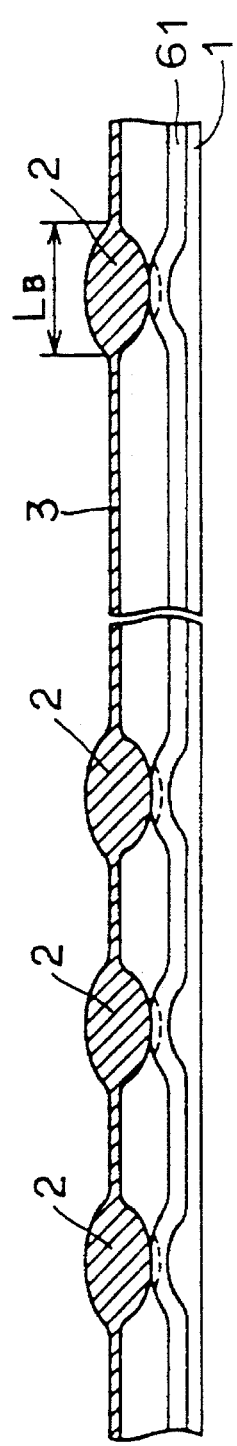
FIG. 7 is a partially cross sectional view showing steps in the order of the manufacture in a method of manufacturing a DRAM to which the first embodiment of the invention is applied.
Figure 7B:
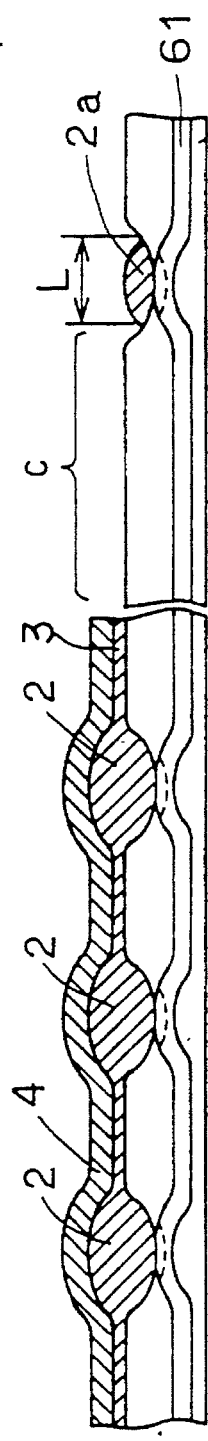
Figure 7C:
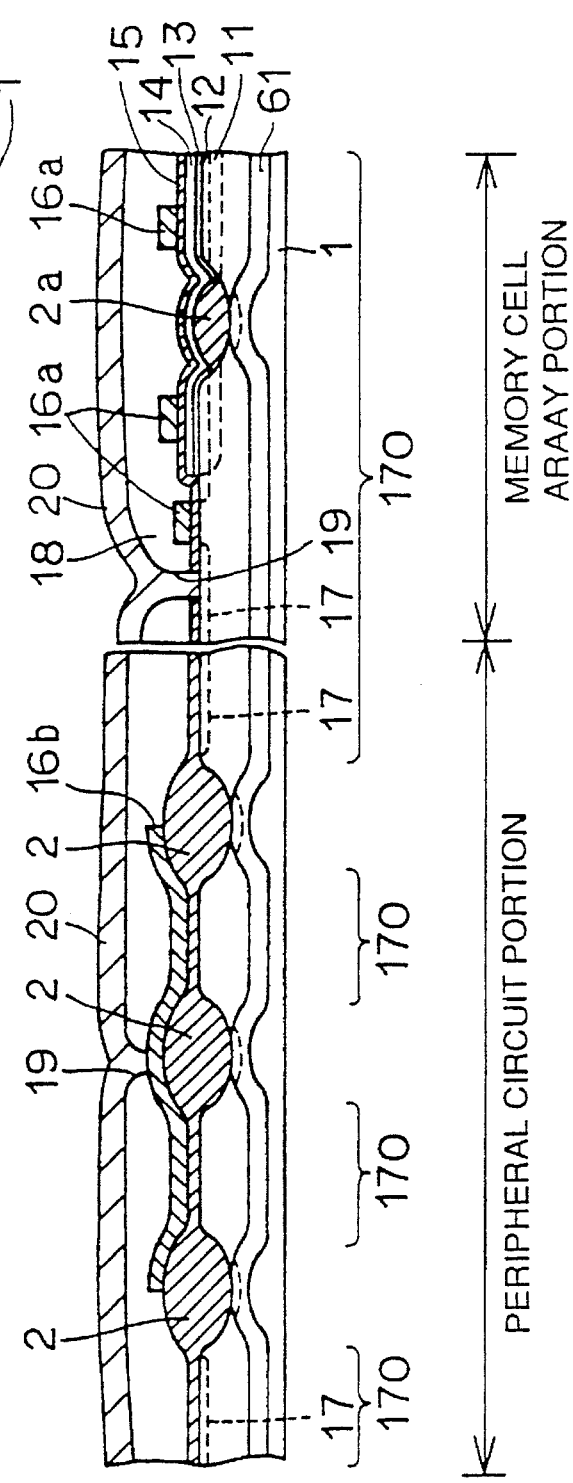

FIG. 7 at (A)–(C) shows in cross section manufacturing steps in a method of manufacturing a DRAM to which the present invention is applied. Referring to FIG. 7 at (A), in the same manner as the steps shown in FIGS. 1–4, a p type retrograde well 61 is formed on a p type silicon substrate. An isolation oxide film 2 has a thickness of about 8000 Å and an isolation length $L_B$. In this state, identical isolation oxide films 2 and p type retrograde wells 61 are formed in both peripheral circuit portion and memory cell array portion.

As illustrated in FIG. 7 at (B) the surface region of the peripheral circuit portion is covered with patterned resist 4. Using patterned resist 4 as mask, an underlying oxide film 3 present at the entire surface of the memory cell array portion and the upper part of isolation oxide film 2 are etched away. The thickness of isolation oxide film 2a of the memory cell array is thinner than the thickness of isolation oxide film 2 remaining in the peripheral circuit portion. The tip end portion of bird's beaks are removed away with reduction of these thicknesses. As a result, the isolation length $L_B$ of the initial isolation oxide film 2 (FIG. 7 (A)) is reduced to the isolation length L of isolation oxide film 2a after the etching. Thus, an element formation region C in the memory cell array portion is expanded.

Then, as illustrated in FIG. 7 at (C), the patterned resist 4 of the peripheral circuit portion is removed away, then boron ions and arsenic ions are selectively implanted into a region including isolation oxide film 2a in order to form a so-called Hi-C structure in a capacitor formation region for memory cells in the memory cell array portion. Thus, as illustrated in FIG. 7 at (C), a p$^+$ impurity region 11 and an n$^+$ impurity 12 are formed. At the time, if the energy for boron ion implantation is set high, boron implanted from the side of the upper surface of isolation oxide film 2a which has been thinned by etching in the step in FIG. 7 at (B) easily penetrates through isolation oxide film 2a to reach p type retrograde well 61. Then, the impurity concentration of a p type retrograde well region 61 for channel stopper positioned under isolation oxide film 2a becomes higher than the initial concentration. As a result, the element isolation capability of thin isolation oxide film 2a is enhanced.

Then, a dielectric film 13 is formed at the memory array portion. A capacitor electrode 14 is selectively formed in isolation oxide film 2a and at least at part of the upper portion of the region including its periphery to form a capacitor portion.

A gate oxide film 15 is formed along the memory cell array portion and the peripheral circuit portion. The transfer gate electrode 16a and the gate electrode 16b of peripheral circuit portion of the memory cell array are formed. Then, n type impurity ions are implanted into silicon substrate 1 using gate electrodes 16a, 16b as mask to form an n$^+$ impurity region 17 for source/drain region.

Then, an oxide film 18 is formed in the entire region bridging the memory cell array portion and the peripheral circuit portion. Oxide film 18 is selectively etched to provide a contact hole 19 at a prescribed position. An aluminum interconnection 20 is formed to be in electric contact with gate electrode 16b and $n^+$ impurity region 17 through contact hole 19.

FIG. 8 is a partial plan view showing the two-dimensional arrangement of a DRAM provided by the foregoing steps. A cross section taken along line VII—VII in FIG. 8 corresponds to FIG. 7 at (C). Aluminum interconnection 20 etc. are omitted in FIG. 8, however, and an element formation region 170 is depicted in correspondence to FIG. 7.

A manufacturing method of the invention is applicable not only to DRAMs but also to any semiconductor device which should secure a sufficient element formation region. Bird's beaks are generated typically by LOCOS, but the method of the invention is applicable to the case in which a transverse exposition is generated in the insulating film when another method of forming an isolation insulating film is employed.

Figure 9:
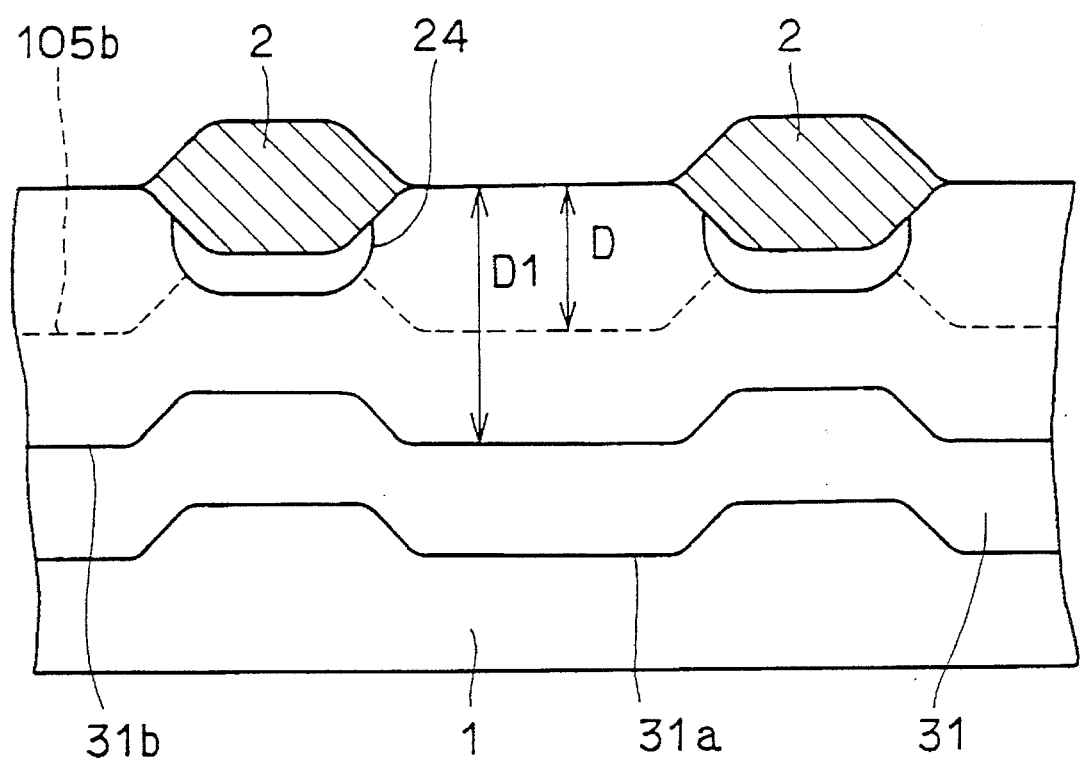
FIG. 9 is a partial cross sectional view showing a semiconductor device formed according to a second embodiment of the invention.
Figure 10:
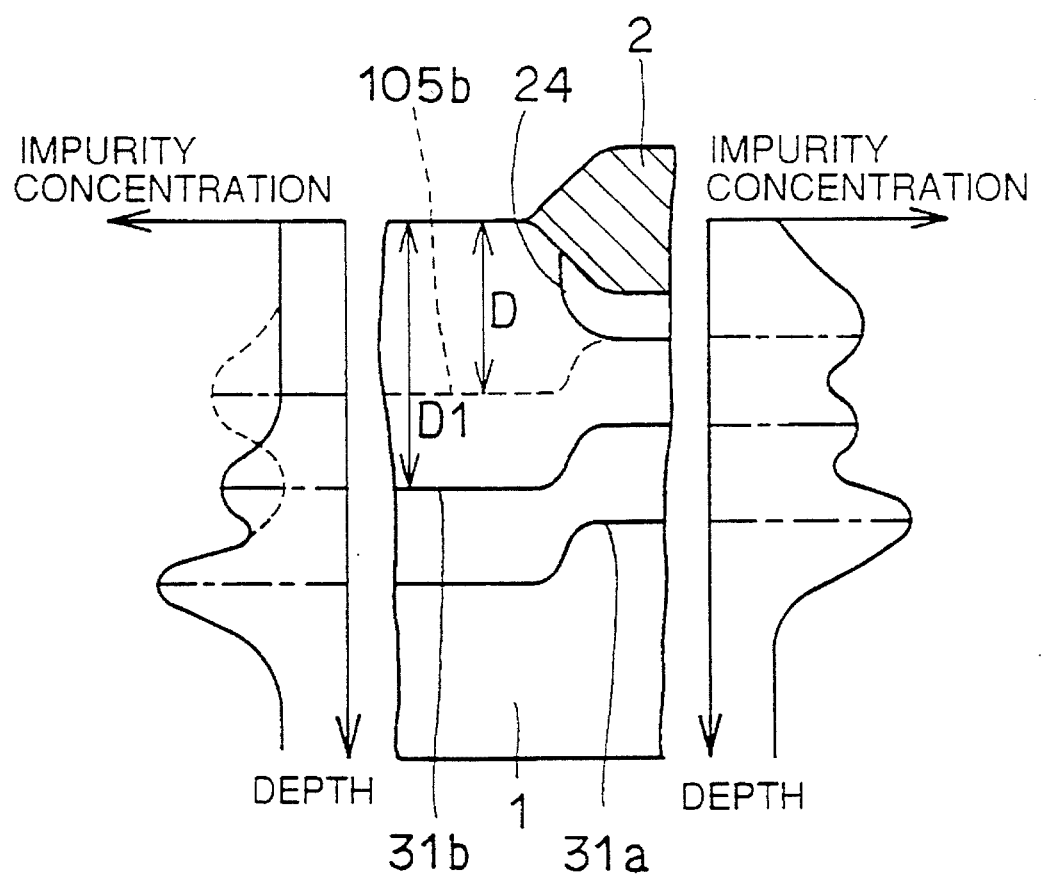
FIG. 10 is a representation showing impurity concentration distribution under the element formation region and under the isolation insulating film in FIG. 9.

Now, the second embodiment of the invention will be described in conjunction with FIGS. 9–14. FIG. 9 is a cross sectional view showing a semiconductor device formed according to the second embodiment of the invention. FIG. 10 is a representation showing an impurity concentration distribution under the element formation region and an impurity concentration distribution under the isolation film of the semiconductor device shown in FIG. 9.

Referring to FIG. 9, a retrograde well 31 is formed in a p type silicon substrate 1. Retrograde well 31 has two impurity concentration peak positions 31a (first impurity concentration peak position) and 31b (second impurity concentration peak position). Isolation oxide films 2 are formed a prescribed distance apart from each other on a main surface of the p type silicon substrate 1. A channel cut layer 24 is formed on the bottom surface of isolation oxide film 2. More specifically, in this embodiment channel cut layer 24 and retrograde well 31 are separately formed. Thus separately forming channel cut layer 24 and retrograde well 31 permits arbitrary selection of a depth for the retrograde well 31. More specifically, retrograde well 31 can be formed at a deep position under the element formation region. Thus, the substrate biasing effect can be suppressed at a small level.

More specifically, as illustrated in FIG. 9, for a conventional retrograde well structure, a second impurity concentration peak position 105b is formed selecting such an energy that impurity is introduced to the region immediately under isolation oxide film 2. The depth (D) of second impurity concentration peak position 105b in the element formation region is determined by the thickness of isolation oxide film 2, and second impurity concentration peak position 105b is formed at a relatively shallow portion in the element formation region.

In contrast, in this embodiment, referring to FIG. 10, since channel cut layer 24 is previously formed, second impurity concentration peak position 31b in retrograde well 31 can be formed in depth D1 which is larger than depth D of conventional second impurity concentration peak position 105b from the surface of p type silicon substrate 1. Thus, the substrate biasing effect can be suppressed to a small level. At the time, channel cut layer 24 is formed only in the region under the bottom surface of isolation oxide film 2 rather than to reach the element formation region. Thus, the narrow channel effect can be suppressed. As described above, a semiconductor device formed according to this embodiment can suppress the substrate biasing effect as well as the narrow channel effect.

Furthermore, in the semiconductor device formed according to the present embodiment, as can be seen from FIG. 10, three impurity concentration peaks are formed under isolation oxide film 2. Thus, isolation capability can be improved as well.

Figure 11:
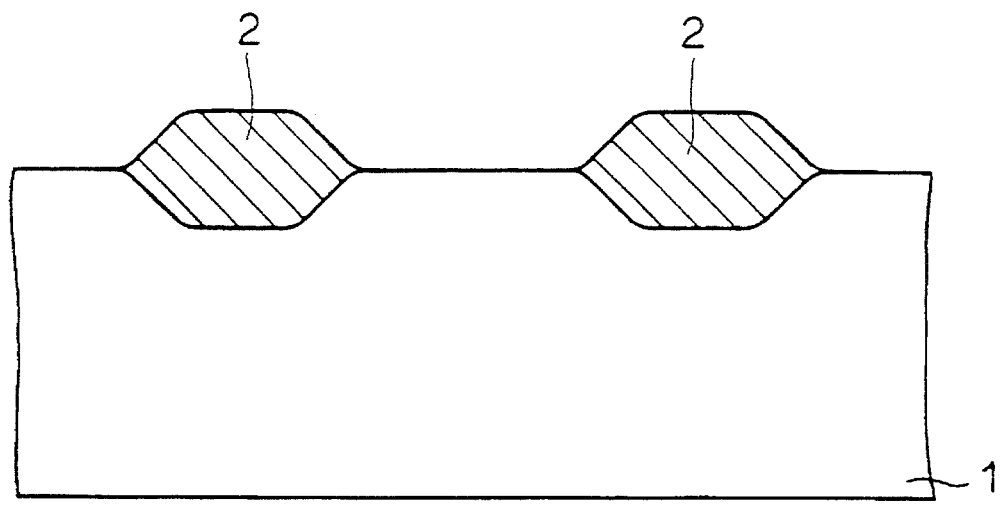
FIGS. 11–14 are partial cross sectional views showing 1st–4th steps in the method of manufacturing a semiconductor device according to the second embodiment of the invention.
Figure 12:
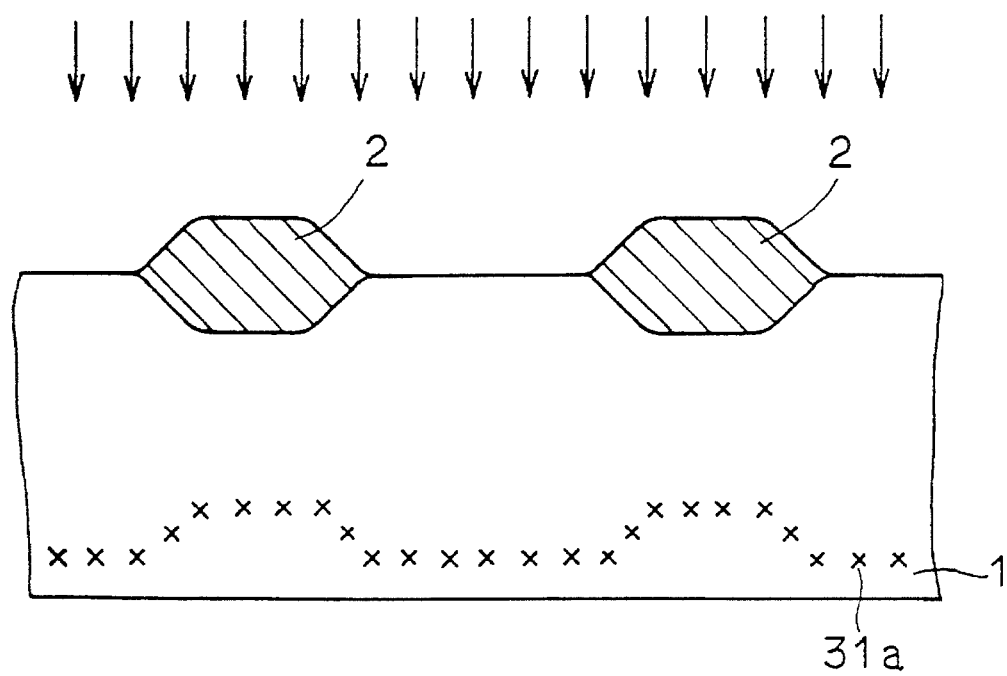

Now, referring to FIGS. 11–14, a method of manufacturing a semiconductor device according to the second embodiment of the invention will be described. Referring to FIG. 11, an isolation oxide film 2, having a prescribed thickness is selectively formed on a main surface of a p type silicon substrate 1. Then, referring to FIG. 12, p type impurity ions are implanted with a high energy through isolation oxide film 2, and the impurity is introduced into first impurity concentration peak position 31a.

Figure 13:
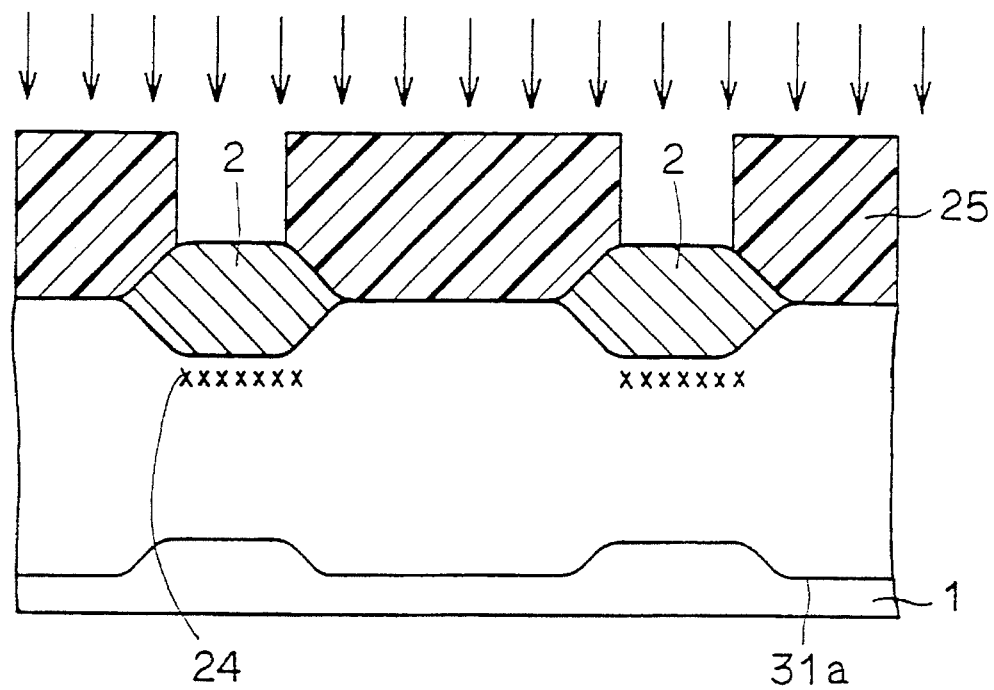

Now, referring to FIG. 13, the upper surface of isolation oxide film 2 is exposed and patterned resist 25 having a prescribed thickness is formed to cover an element formation region. A p type impurity is implanted using patterned resist 25 as mask. At the time, the implantation energy is so adjusted that the p type impurity is implanted in the vicinity of the lower surface of isolation oxide film 2. Thus, channel cut layer 24 is formed.

Figure 14:
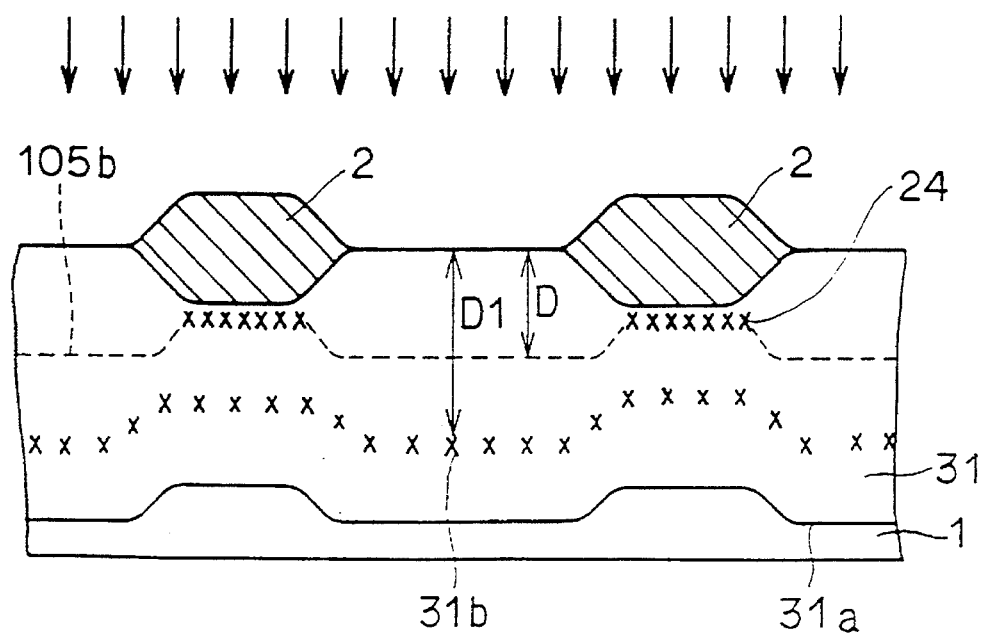

Referring to FIG. 14, after impurity implantation is performed for forming channel cut layer 24, patterned resist 25 is removed away. Then, high energy ion implantation for forming a retrograde well 31 is performed. Thus, a second impurity concentration peak position 31b is formed at a position deeper than second impurity concentration peak position 105b in the conventional retrograde well structure at the time, second impurity concentration peak position 31b is formed in a separate step from the impurity implantation for forming channel cut layer 24. Therefore, second impurity concentration peak position 31b can be formed at a position deeper than second impurity concentration peak position 105b in the conventional retrograde well structure. As a result, in this embodiment, the depth D1 of second impurity concentration peak position 31b is larger than the depth D of conventional second impurity concentration peak position 105b. Thus, the substrate biasing effect can be kept at a small level than the conventional structure. The depth of forming retrograde well 31 varies among devices, and therefore an optimum value is preferably selected for each device.

As described above, in this embodiment, after forming insulating oxide film 2, channel cut layer 24 is formed in the vicinity of the bottom surface of insulating oxide film 2. Accordingly, channel cut layer 24 is not diffused and prevented from extending into the element formation region. Thus, the narrow channel effect can be suppressed. Since formation of channel cut layer 24 and formation of retrograde well 31 are separately performed, retrograde well 31 can be formed at a deep position of p type silicon substrate 1. More specifically, unlike a conventional device, the depth at which retrograde well 31 is formed is not determined by the thickness of insulating oxide film 2. Thus, forming retrograde well 31 at a deep position of p type silicon substrate 1 restricts the substrate biasing effect to a small level.

Figure 15:
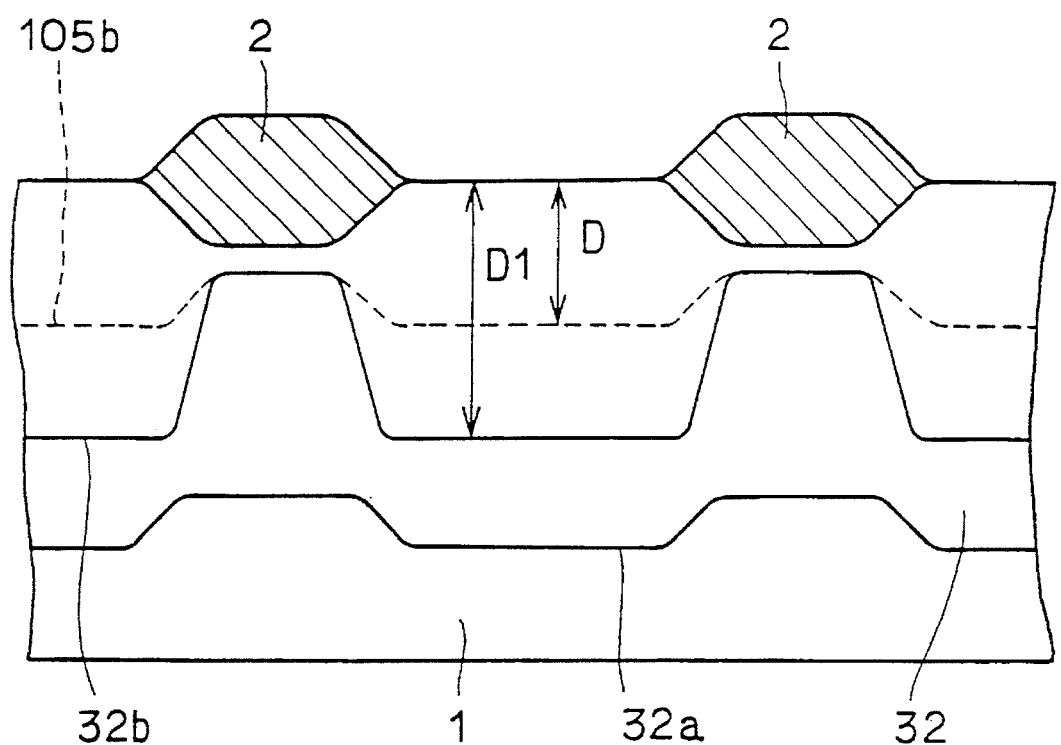
FIG. 15 is a partial cross sectional view showing a semiconductor device formed according to a third embodiment of the invention.
Figure 16:
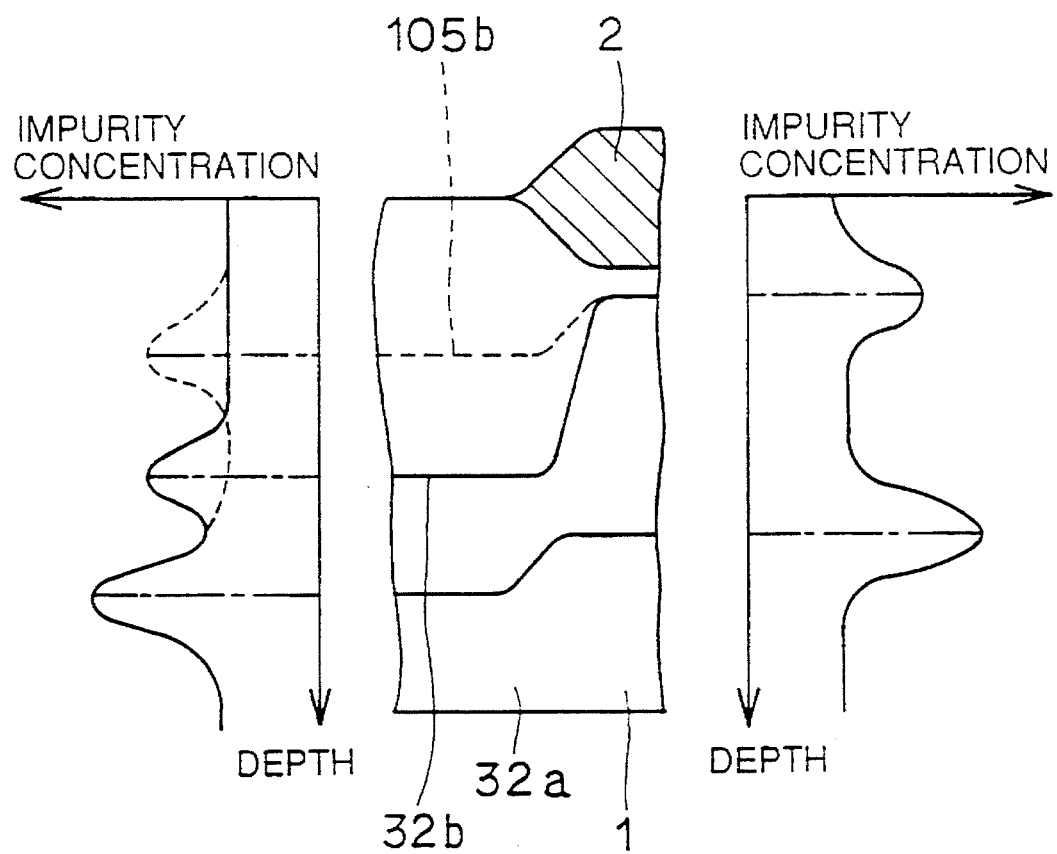
FIG. 16 is a representation showing impurity concentration distribution under the element formation region and under the isolation insulating film of the semiconductor device shown in FIG. 15.

Referring to FIGS. 15–19, the third embodiment of the invention will be described. FIG. 15 is a cross sectional view showing a semiconductor device formed according to the third embodiment of the invention. FIG. 16 is a representation showing impurity concentration distribution under the element formation region and isolation oxide film 2 of the semiconductor device shown in FIG. 15.

Referring to FIG. 15, the semiconductor device formed according to the this embodiment has a first impurity concentration peak position 32a formed in p type silicon substrate 1, and a second impurity concentration peak position 32b is formed a prescribed space apart from and above first impurity concentration peak position 32a. First and second impurity concentration peak positions 32a and 32b constitute a retrograde well 32.

Second impurity concentration peak position 32b according to this embodiment is formed extending from the vicinity of the bottom surface of isolation oxide film 2 to a deep position of the element formation region. More specifically, second impurity concentration peak position 32b is formed at a position deeper than the depth D of second impurity concentration peak position 105b of the element formation region from the surface of p type silicon substrate 1 in the retrograde well formed according to the conventional method, a position in depth D1 from the surface of substrate 1 in this case. Thus, the narrow channel effect can be suppressed as well as the substrate biasing effect can be restricted to a small level.

Referring to FIG. 16, according to the semiconductor device formed according to this embodiment, two impurity concentration peak positions 32a, 32b are formed at deep positions of the element formation region. Thus, impurity concentration in the shallow portion of the element formation region can be suppressed. This restricts the substrate biasing effect. Meanwhile, under isolation oxide film 2, tow impurity concentration peak positions are formed in this embodiment. Thus, this embodiment provides element isolation capability equivalent to the conventional retrograde well.

Figure 17:
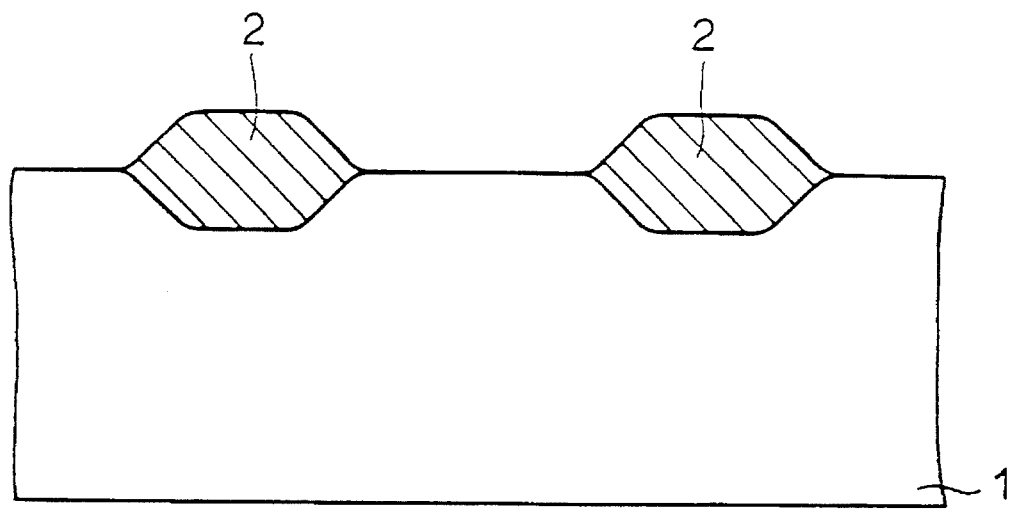
FIGS. 17–19 are partial cross sectional views showing 1st–3rd steps in the method of manufacturing a semiconductor device according to the third embodiment of the invention.
Figure 18:
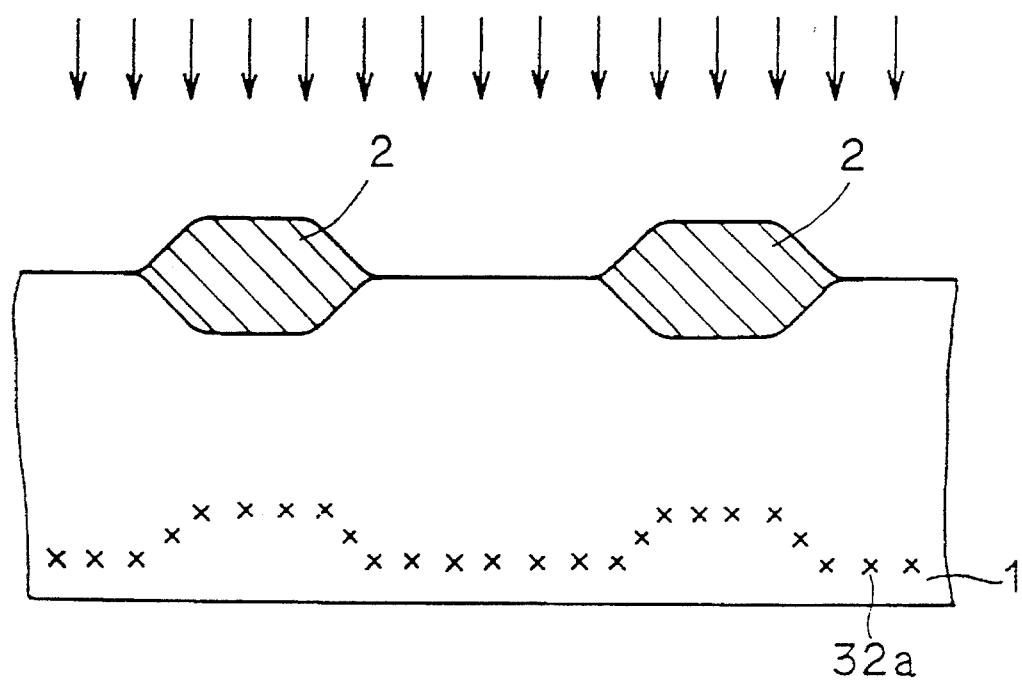
Figure 19:
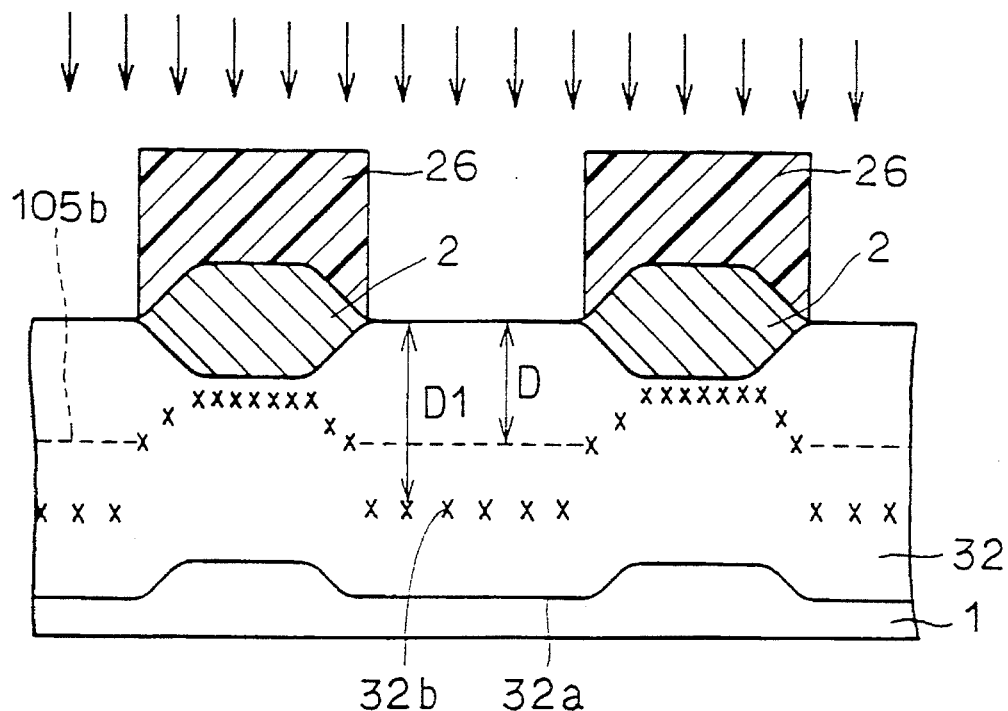

Referring to FIGS. 17–19, a method of manufacturing the semiconductor device according to the third embodiment of the invention will be described. FIGS. 17–19 are cross sectional views showing 1st–3rd steps in a method of manufacturing the semiconductor device according to the third embodiment of the invention.

Referring to FIG. 17, isolation oxide film 2 having a prescribed thickness is selectively formed on a main surface of p type silicon substrate 1. Referring to FIG. 18, p type impurity ions are implanted with high energy to introduce the impurity for forming first impurity concentration peak position 32a. Then, referring to FIG. 19, the element formation region is exposed and patterned resist 26 having a prescribed thickness is formed to cover isolation oxide film 2. Ion implantation with such energy that the impurity can reach the vicinity of the bottom surface of isolation oxide film 2 is performed through patterned resist 26 and isolation oxide film 2, and second impurity concentration peak position 32b is formed as a result. First impurity concentration peak position 32a and second impurity concentration peak 32b form retrograde well 32.

At the time, the depth D1 of second impurity concentration peak position 32b is larger than the depth in the case of forming second impurity concentration peak position 105b according to the same method as the conventional example. Thus, the substrate biasing effect can be suppressed. The depth of second impurity concentration peak position 32b, in this case, can be controlled by the thickness of patterned resist 26. Appropriately adjusting the thickness of patterned resist 26 permits formation of a second impurity concentration peak position 32b of an optimum depth for each device. As illustrated in FIG. 19, since second impurity concentration peak position 32b is formed extending from the region under isolation oxide film 2 to a deep position under the element formation region, the narrow channel effect is suppressed. Thus, a semiconductor device with the narrow channel effect restricted and substrate biasing effect restricted can be provided.

Referring to FIGS. 20–24, the fourth embodiment of the invention will be described. FIGS. 20–24 are cross sectional views showing 1st–5th steps in a method of manufacturing a semiconductor device formed according to the fourth embodiment of the invention.

Figure 20:
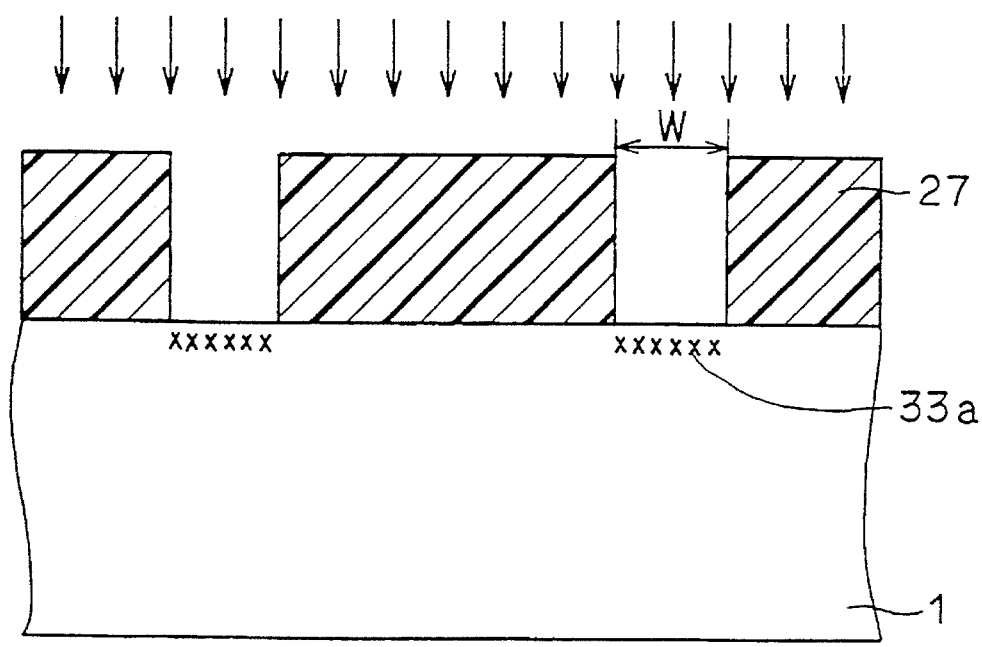
FIGS. 20–24 are partial cross sectional views showing 1st–5th steps in a method of manufacturing a semiconductor device according to a fourth embodiment of the invention.

Referring to FIG. 20, part of an element isolation region is exposed and patterned resist 27 is formed to cover the element formation region. At the time, the opening width W of patterned resist 27 takes a smaller value than element isolation width W 1 (which will be described later). Ions are implanted using patterned resist 27 as mask to introduce the impurity 33a for channel cut layer formation into the element isolation region. Then, patterned resist 27 is removed away.

Figure 21:
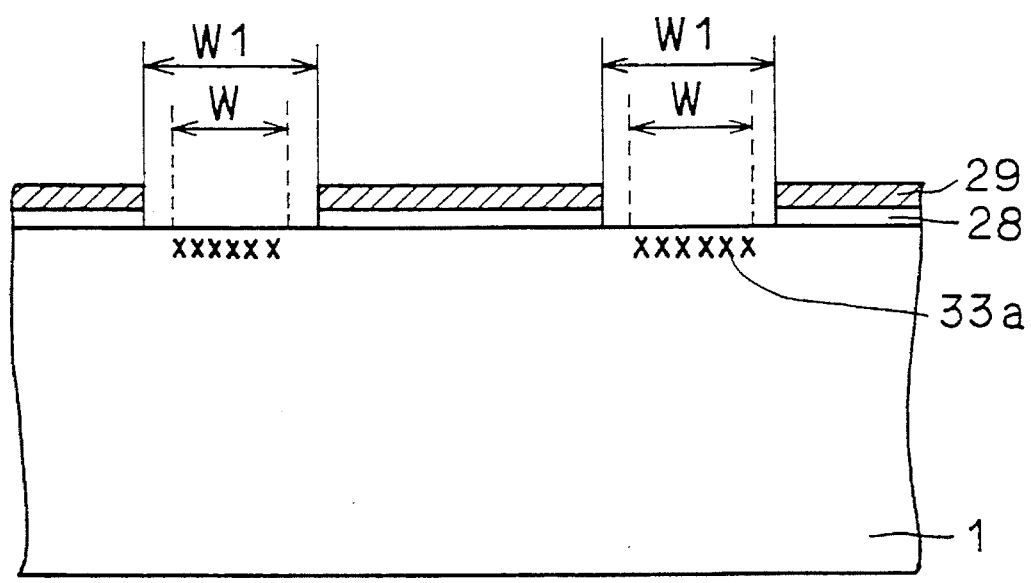

Referring to FIG. 21, an oxide film 28 and a nitride film 29 are formed sequentially on a surface of p type silicon substrate 1. Then, nitride film 29 and oxide film 28 are patterned to form an opening portion having element isolation width W1. Element isolation width W1 is selected to take a value larger than the opening width W of patterned resist 27. More specifically, the values of W and W1 are selected so that the impurity 33a will not diffuse into the element formation region by thermal treatment when an isolation oxide film is formed in a subsequent step. Thus appropriately selecting the values of W and W1 permits the narrow channel effect to be suppressed.

Figure 22:
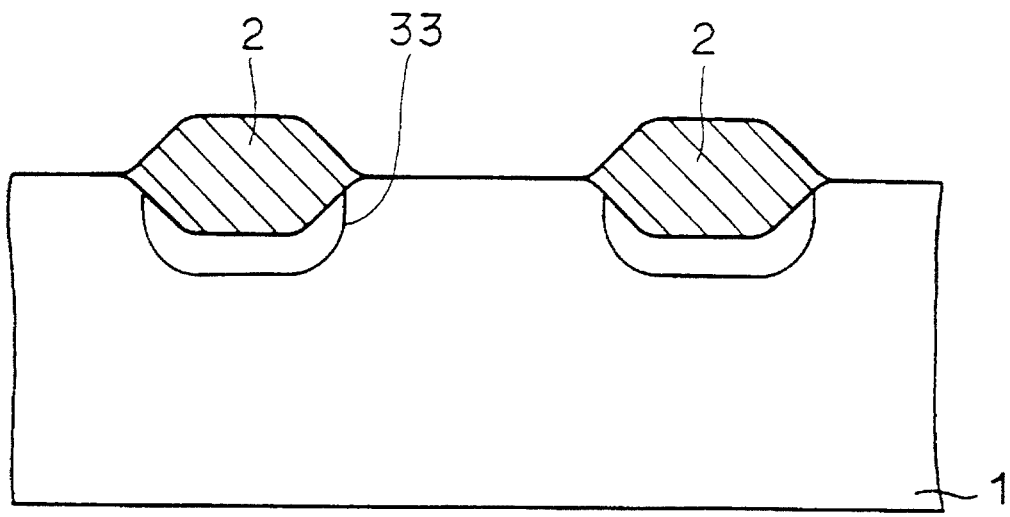

Referring to FIG. 22, isolation oxide film 2 having a prescribed thickness is selectively formed on the surface of p type silicon substrate 1 by selective oxidation. At the time, a channel cut layer 33 is formed in the vicinity of the bottom surface of isolation oxide film 2. In forming channel cut layer 33, conditions are selected so that impurity 33a for forming channel cut layer 33 introduced into the element isolation region will not diffuse into the element formation region by the formation of isolation oxide film 2. Therefore, channel cut layer 33 is formed only in the vicinity of the bottom surface of insulating oxide film 2.

Figure 23:
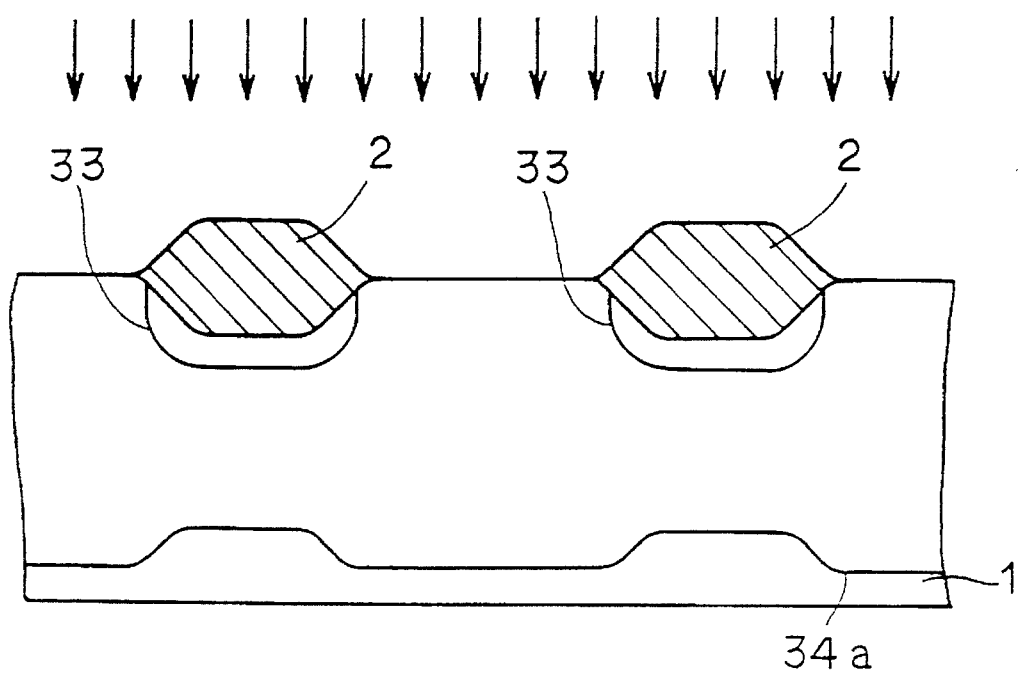
Figure 24:
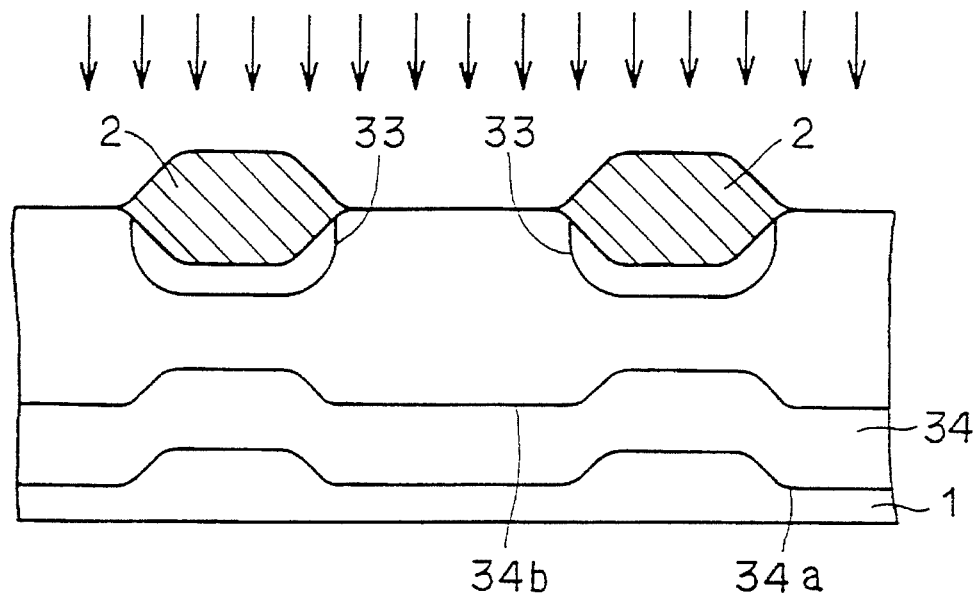

Now, referring to FIG. 23, p type impurity ions are implanted with a prescribed energy to form a first impurity concentration peak position 34a. Then, as illustrated in FIG. 24, p type impurity ions are implanted again with a prescribed energy to form a second impurity concentration peak position 34b at a position shallower than first impurity concentration peak position 34a. Thus, a retrograde well 34 is formed. At the time, since second impurity concentration peak position 34b can be formed at a deep position in p type silicon substrate 1, the substrate biasing effect can be suppressed. In the above-described fourth embodiment, appropriately adjusting the amount of impurity 33a implanted permits adjustment of the amount of expansion of channel cut layer 33.

Referring to FIGS. 25–28, the fifth embodiment of the invention will be described. FIGS. 25–28 are cross sectional views showing 1st–4th steps in a method of manufacturing a semiconductor device according to the fifth embodiment of the invention.

Figure 25:
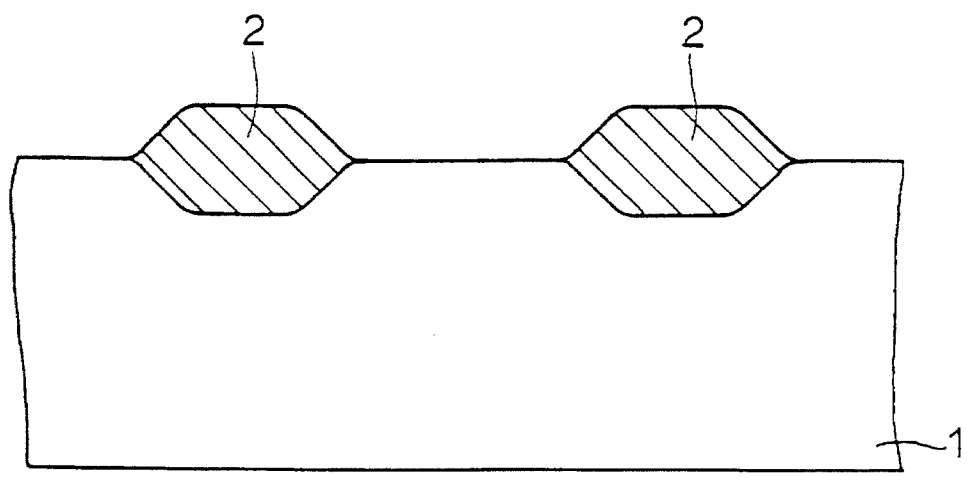
FIGS. 25–28 are partial cross sectional views showing 1st–4th steps in a method of manufacturing a semiconductor device according to a fifth embodiment of the invention.
Figure 26:
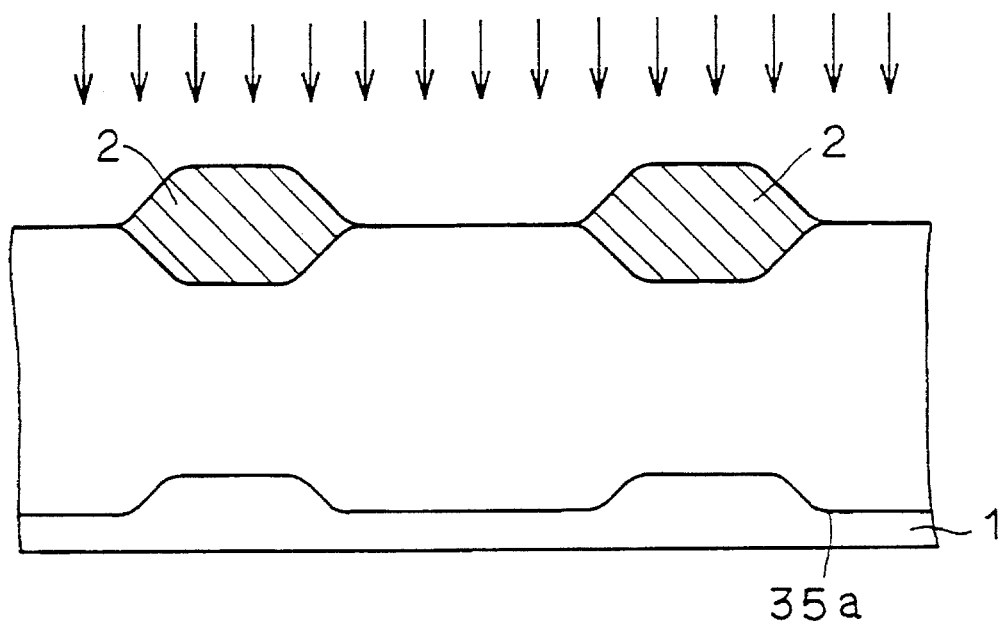
Figure 27:
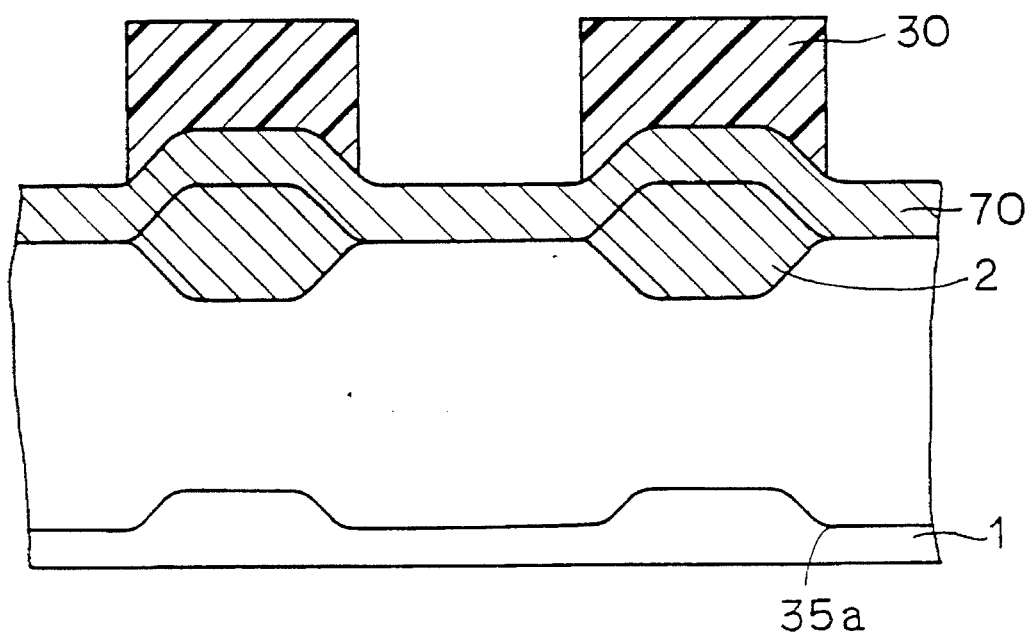

Referring to FIG. 25, an isolation oxide film 2 having a prescribed thickness is selectively formed on a main surface of p type silicon substrate 1. Then, referring to FIG. 26, impurity is introduced to a deep position in p type silicon substrate 1 to form a first impurity concentration peak position 35a. Then, referring to FIG. 27, an oxide film 70 formed of a TEOS (Tetra Ethyl Ortho Silicate) film or the like is formed on the entire surface of p type silicon substrate by means of chemical vapor deposition or the like. Resist is applied on oxide film 36. Then, patterning is performed with oxide film 70 positioned on isolation oxide film 2 being covered and with oxide film 70 positioned on the element formation region being exposed to form patterned resist 30.

Figure 28:
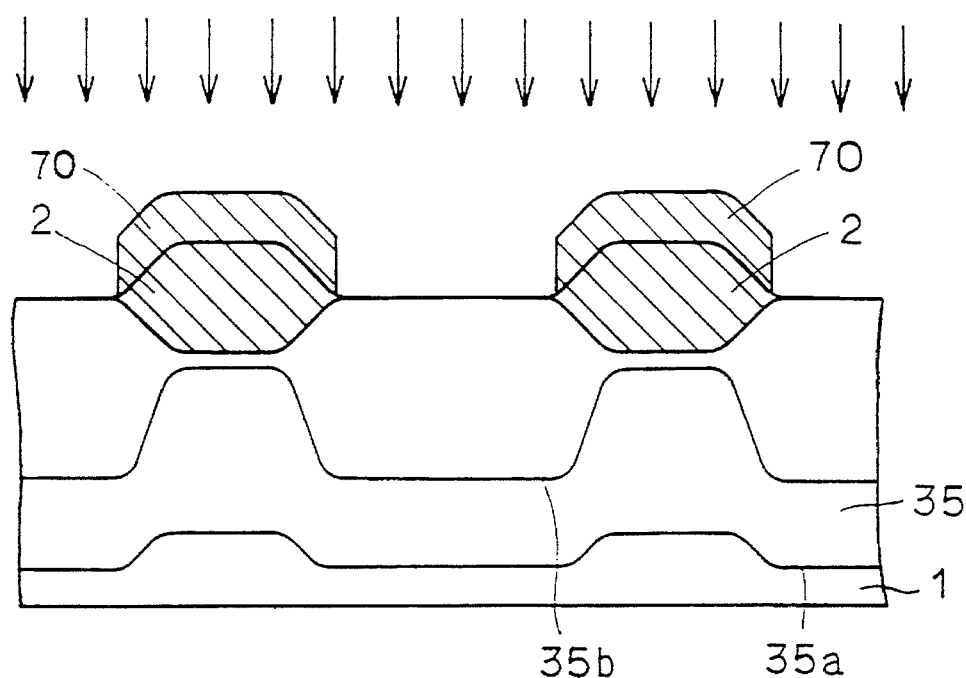

Then, oxide film 70 is etched using patterned resist 30 as mask, and then patterned resist 30 is removed away. Thereafter, as illustrated in FIG. 28, high energy ion implantation is performed from the surface of p type silicon substrate 1 to form a second impurity concentration peak position 35b extending from the vicinity of the bottom surface of insulating oxide film 2 to a deep position of the element formation region. Second impurity concentration peak position 35b and first impurity concentration peak position 35a described above form a retrograde well 35.

In the above-described manner, the formation of second impurity concentration peak position 35b restricts the narrow channel effect as in the case of the abovedescribed embodiments. Furthermore, forming second impurity concentration peak position 35b at a deep position under the element formation region can restrict the substrate biasing effect to a small level. Since oxide film 70 is formed on isolation oxide film 2, the thickness of the isolation oxide film is substantially increased. This permits improvement of the isolation characteristic.

Now, the characteristic part of the fifth embodiment will be described in more detail. In the fifth embodiment, oxide film 70 is formed on isolation oxide film 2. P type impurity is introduced into p type silicon substrate 1 with such energy to penetrate a stacked structure of isolation oxide film 2 and oxide film 70. Thus, as compared to the conventional example in which impurity is implanted to penetrate only isolation oxide film 2, the impurity can be implanted into a deep position in the element formation region in p type silicon substrate 1. More specifically, the impurity can be introduced at a position deeper by the amount of depth corresponding to the thickness of oxide film 70. Thus, the substrate biasing effect can be restricted to a small level. Appropriately adjusting the thickness of oxide film 70 permits introduction of the impurity into a depth appropriate for each device.

Figure 29:
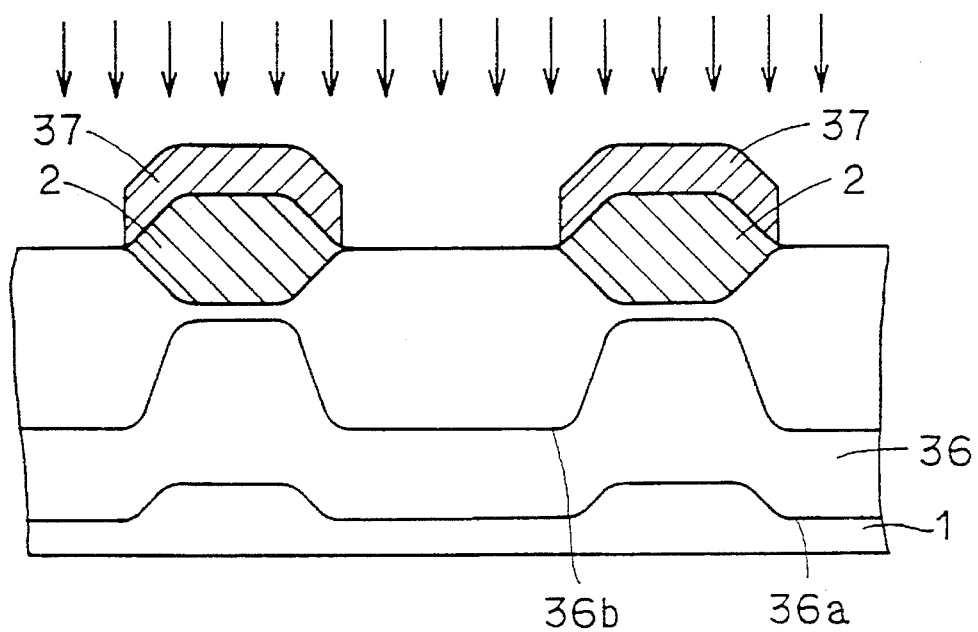
FIGS. 29–30 are partial cross sectional views showing 4th–5th steps in a method of manufacturing a semiconductor device according to a sixth embodiment of the invention.
Figure 30:
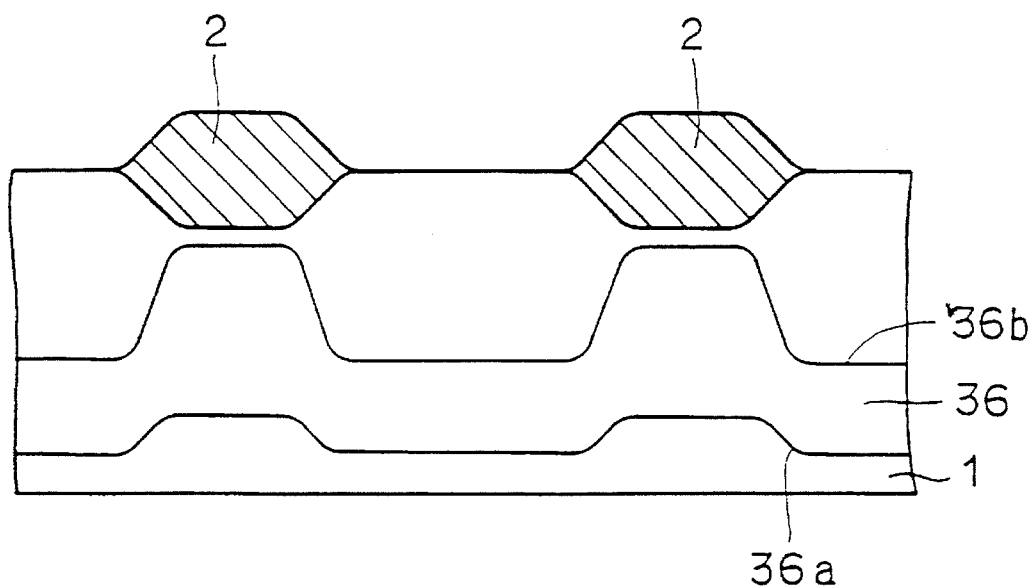

Referring to FIGS. 29 and 30, the sixth embodiment of the invention will be described. FIGS. 29 and 30 are cross sectional views showing 4 th–5 th steps in a method of manufacturing a semiconductor device according to the sixth embodiment of the invention. In the fifth embodiment described above, oxide film 70 having a prescribed thickness is formed on insulating oxide film 2. In contrast, in this embodiment, a nitride film 37 is formed on isolation oxide film 2 through the same steps as the fifth embodiment. Referring to FIG. 29, a second impurity concentration peak position 36 is formed by implanting impurity with such energy as to penetrate nitride film 37 and isolation oxide film 2, and then as illustrated in FIG. 30, nitride film 37 is removed away. Thus, removing nitride film 37 reduces unevenness in the surface of p type silicon substrate 1 as compared to the fifth embodiment. As in the case of the above-described embodiments, the narrow channel effect and the substrate biasing effect can be restricted to a small level in this embodiment.

Note that also in the fifth embodiment, unevenness by isolation oxide film 2 can be reduced by previously forming a thin nitride film on isolation oxide film 2, then removing away oxide film 70 and the removing the nitride film as well.

Figure 31:
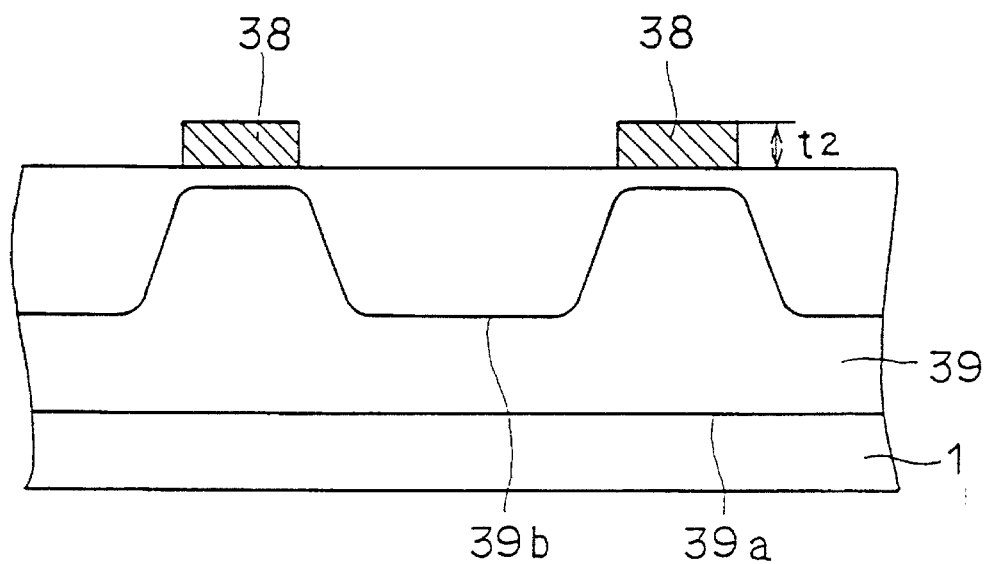
FIG. 31 is a partial cross sectional view showing a semiconductor device formed according to a seventh embodiment of the invention.

Now, referring to FIGS. 31–34, the seventh embodiment of the invention will be described. FIG. 31 is a cross sectional view showing a semiconductor device formed according to the seventh embodiment of the invention.

Figure 32:
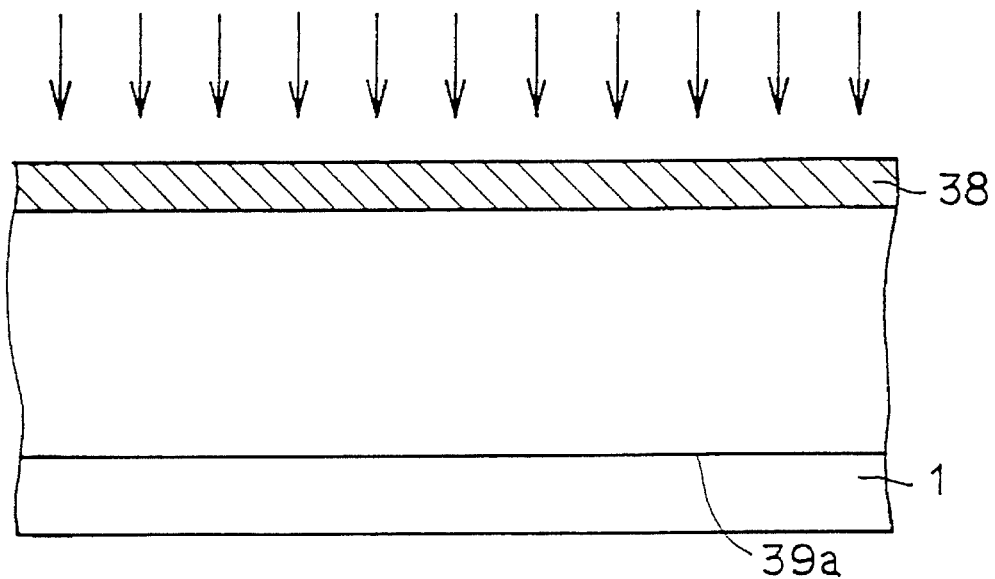
FIGS. 32–34 are partial cross sectional views showing 1st–3rd steps in a method of manufacturing a semiconductor device according to the seventh embodiment of the invention.
Figure 33:
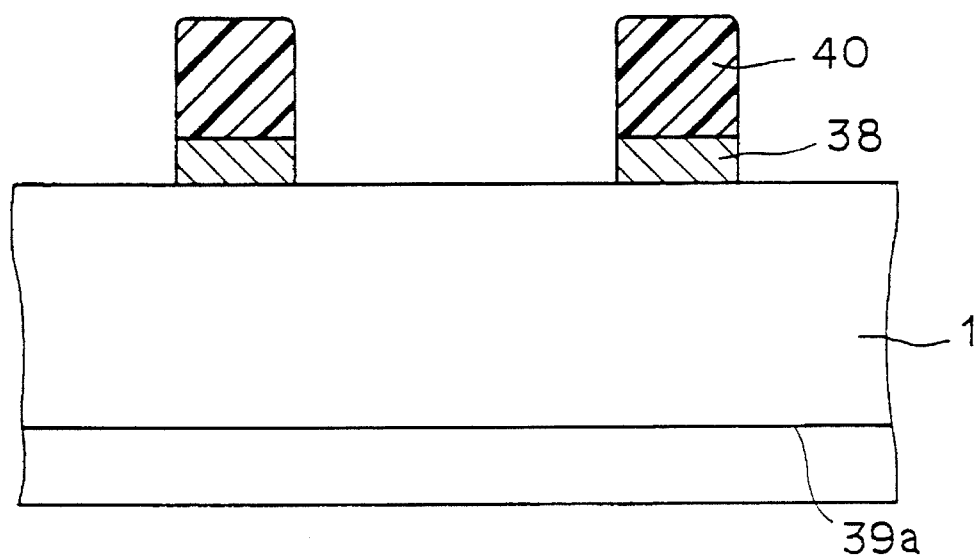
Figure 34:
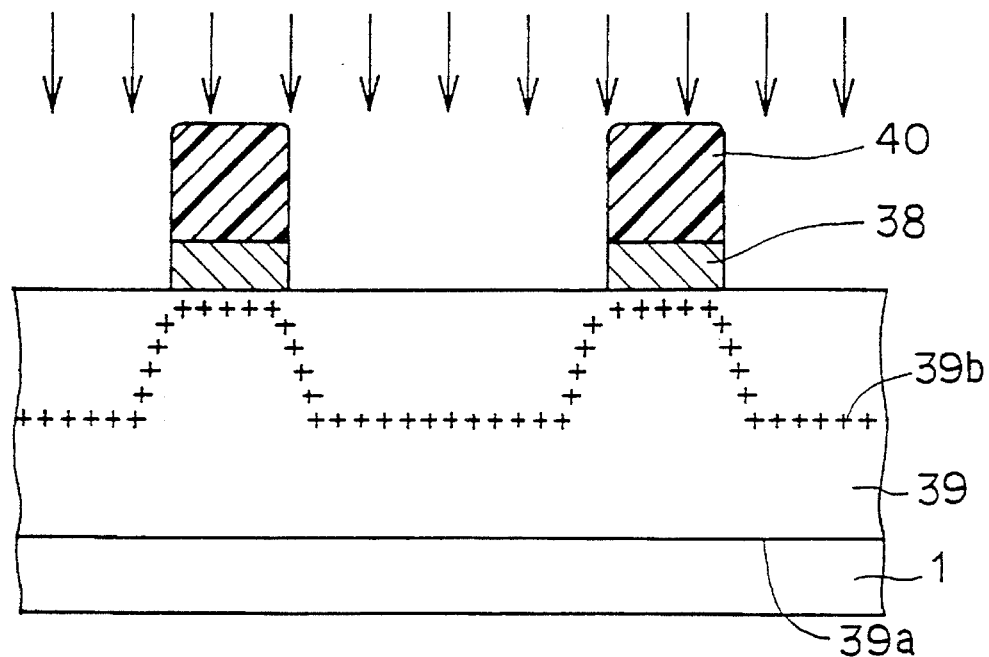

FIGS. 32–34 are cross sectional views showing manufacturing steps in a method of manufacturing the semiconductor device according to the seventh embodiment of the invention.

Referring to FIG. 31, the semiconductor device formed according to the embodiment has an oxide film 38 having a thickness about in the range from 1000 Å to 5000 Å in an element isolation region on a p type silicon substrate 1. Oxide film 38 becomes an isolation oxide film. A second impurity concentration peak position 39a is formed from the vicinity of the bottom surface of oxide film 38 to a deep position under the element formation region. Under second impurity concentration peak position 39b, a first impurity concentration peak position 39a is formed a prescribed space apart from the second impurity concentration peak position 39b. First impurity concentration peak position 39a and second impurity concentration peak position 39b form a retrograde well 39. As illustrated in FIG. 31, since second impurity concentration peak position 39b is formed at a deep position under the element formation region, the substrate biasing effect can be restricted to a small level. Since second impurity concentration peak position 39b is formed to extend from under oxide film 38 to a deep position under the element formation region, the narrow channel effect can be suppressed.

Referring to FIGS. 32–34, a method of manufacturing the semiconductor device according to the seventh embodiment of the invention will be described. Referring to FIG. 32, oxide film 38 having a thickness about in the range from 1000 to 5000 Å is formed on the surface of p type silicon substrate 1 by means of chemical vapor deposition or thermal oxidation. Then, first impurity concentration peak position 39a is formed at a deep position of p type silicon substrate 1. Referring to FIG. 33, resist 40 is applied onto oxide film 38. The thickness of resist 40 is preferably about in the range from 5000 Å to 20000 Å. Resist 40 is patterned to leave resist 40 positioned on the element isolation region. Using resist 40 as mask, oxide film 38 is etched.

Referring to FIG. 34, boron (B) ions for example are implanted into p type silicon substrate 1 with such energy to penetrate oxide film 38 and resist 40. At the time, the implantation energy is selected so that the impurity penetrates resist 40 and oxide film 38 and is introduced into p type silicon substrate 1 in the vicinity of the bottom surface of oxide film 38. At the time, since the surface of p type silicon substrate 1 on the element formation region is exposed, the impurity is introduced into a deep position under the element formation region of p type silicon substrate 1 if the impurity is introduced with the high energy described above. Thus, the substrate biasing effect can be suppressed to a small level. As in the case of the above-described embodiments, the narrow channel effect can be suppressed as well.

Figure 35:
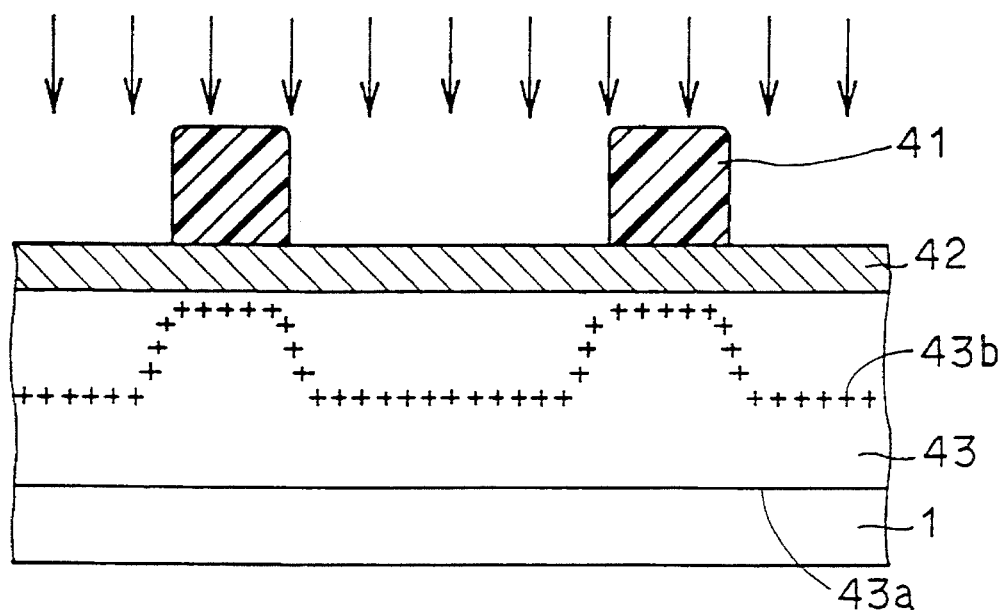
FIGS. 35–36 are partial cross sectional views showing 2nd–3rd steps in a method of manufacturing a semiconductor device according to an eighth embodiment of the invention.
Figure 36:
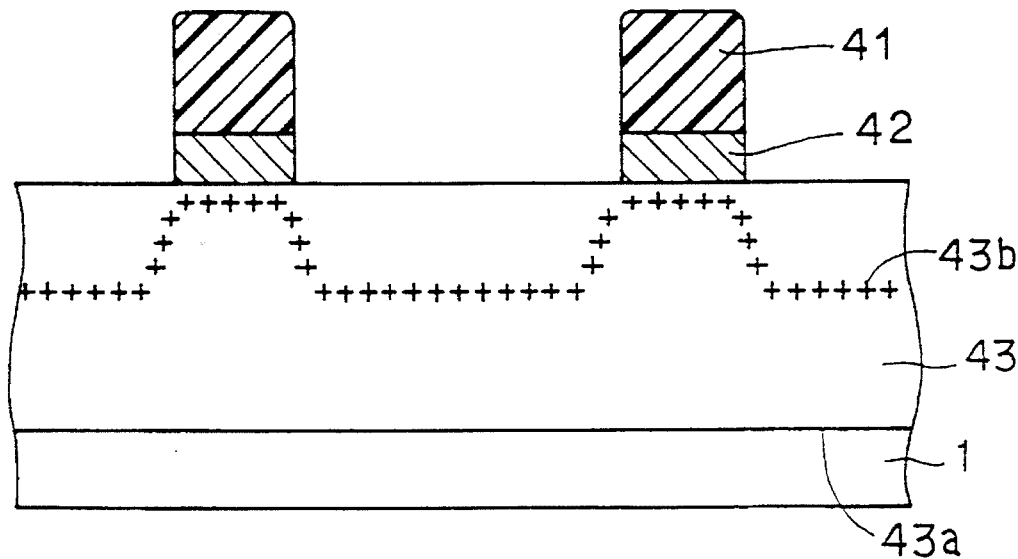

Now, referring to FIGS. 35 and 36, the eighth embodiment of the invention will be described. FIGS. 35 and 36 are cross sectional views showing manufacturing steps in a method of manufacturing a semiconductor device according to the eighth embodiment of the invention.

First, a first impurity concentration peak position 43a is formed in a p type silicon substrate 1 through the same steps as in the seventh embodiment, and an oxide film 42 having a prescribed thickness is formed on the surface of p type silicon substrate 1. Referring to FIG. 35, resist 41 is applied on oxide film 42 to a prescribed thickness, and resist 41 is patterned to leave resist 41 in the region positioned on the element isolation region. Then, p type impurity ions such as of boron (B) are implanted into the vicinity of the bottom surface of oxide film 42 positioned under resist 41.

At the time, the impurity is introduced into p type silicon substrate 1 penetrating only oxide film 42 in the element formation region. Therefore, in the element formation region, the p type impurity is introduced into a depth corresponding to the thickness of resist 41. Accordingly, increasing the thickness of resist 41 permits introduction of the p type impurity into a deep position in p type silicon substrate 1, and therefore the substrate biasing effect can be suppressed to a small level.

Furthermore, at the time, the impurity introduced into the region other than the region positioned under resist 41 will be introduced into silicon substrate 1 at a deeper position than the impurity introduced under resist 41, and therefore the narrow channel effect can be suppressed. Furthermore, in the case of this embodiment, since the surface of p type silicon substrate 1 is not exposed at the time of implanting the impurity, contamination with a metal or the like at the time of ion implantation can advantageously be restricted.

Second impurity concentration peak position 43b is thus formed. Second impurity concentration peak position 43b and first impurity concentration peak position 43a form a retrograde well 43. Thus, after forming retrograde well 43, using resist 41 as mask oxide film 42 is etched. Thus, oxide film 42 is left only in the element isolation region. Oxide film 42 becomes an isolation oxide film 42. Then, resist 41 is removed away.

Figure 37:
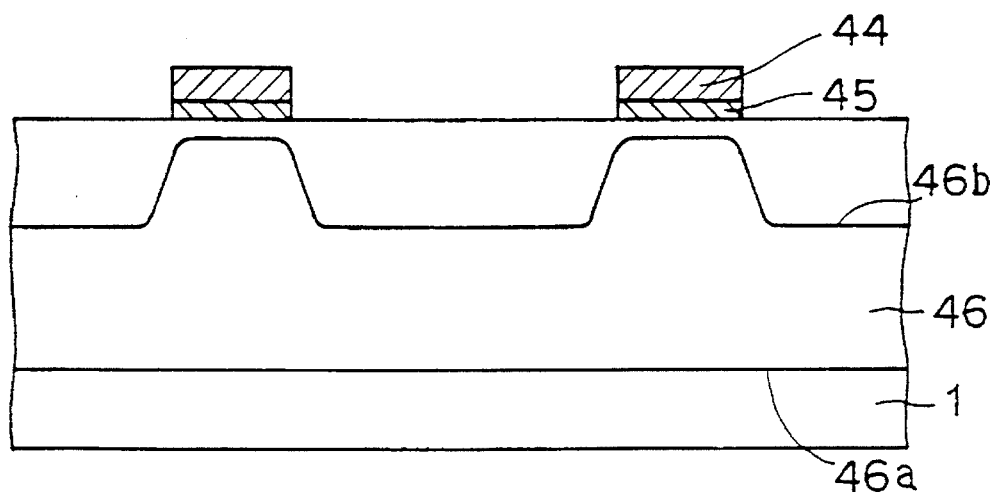
FIG. 37 is a partial cross sectional view showing a semiconductor device formed according to a ninth embodiment of the invention.
Figure 38:
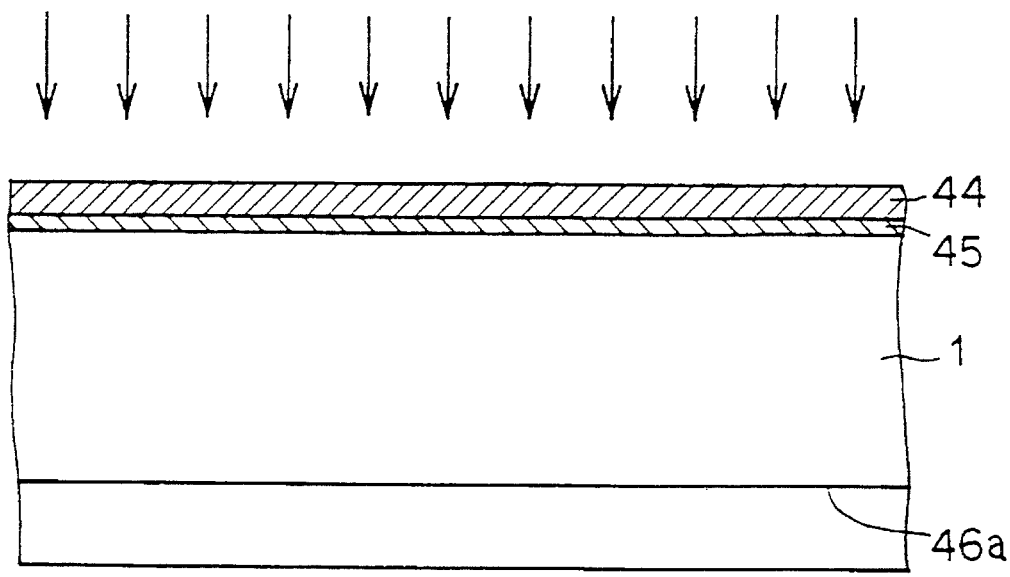
FIGS. 38–40 are partial cross sectional views showing 1st–3rd steps in a method of manufacturing a semiconductor device according to the ninth embodiment of the invention.
Figure 39:
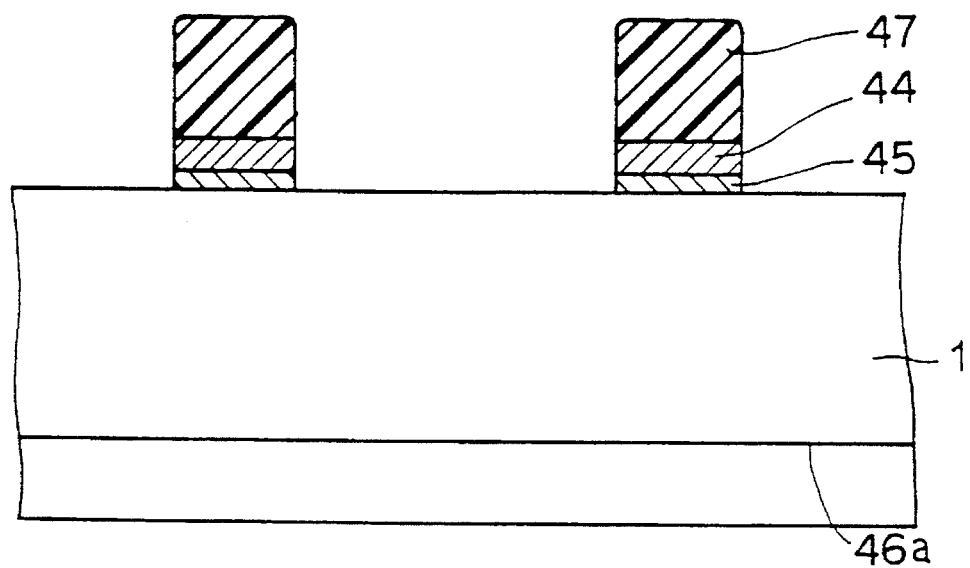
Figure 40:
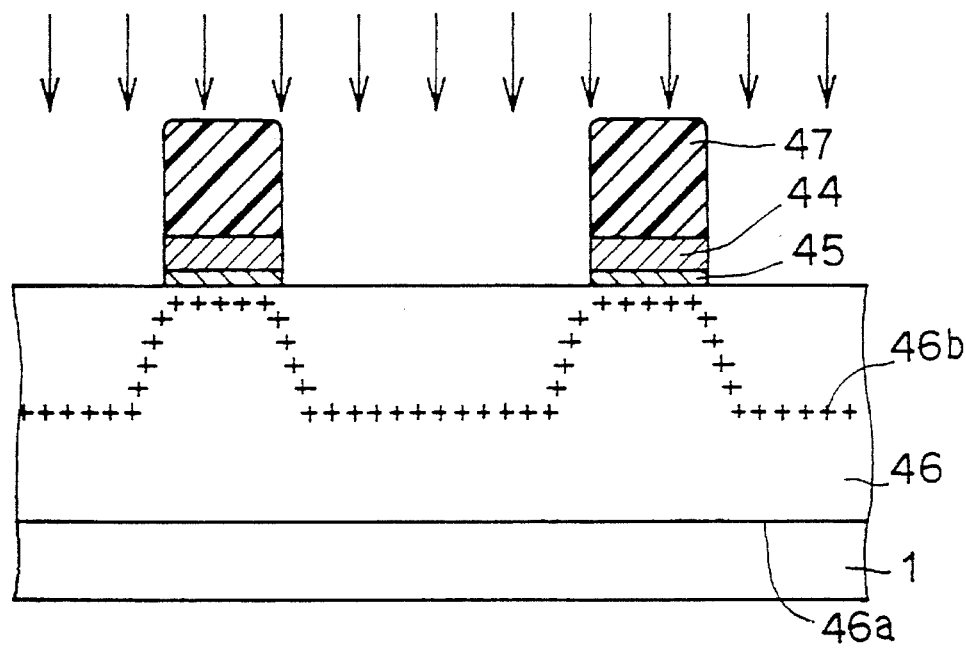

Referring to FIGS. 37–40, the ninth embodiment of the invention will be described. FIG. 37 is a cross sectional view showing a semiconductor device formed according to the ninth embodiment of the invention. FIGS. 38–40 are cross sectional views showing manufacturing steps in a method of manufacturing a semiconductor device according to the ninth embodiment of the invention.

Referring to FIG. 37, in this embodiment, a conductive layer such as a polycrystalline silicon film 44 is formed in an element isolation region on the surface of a p type silicon substrate 1 with an insulating film 45 such as an oxide film therebetween. This is a so called field shield structure. In p type silicon substrate 1, a second impurity concentration peak position 46b is formed to extend from the vicinity of the bottom surface of insulating film 45 toward a deep position under the element formation region in p type silicon substrate 1, and a first impurity concentrating peak position 46a is formed a prescribed space apart under second impurity concentration peak position 46b. First impurity concentration peak position 46a and second impurity concentration peak position 46b form a retrograde well 46. Such a structure permits restriction of the narrow channel effect and the substrate biasing effect to a small level as in the case of the foregoing embodiments.

Referring to FIGS. 38–40, a method of manufacturing the semiconductor device having the above-described structure will be described. Referring to FIG. 38, insulating film 45 having a prescribed thickness and polycrystalline silicon film 44 are deposited in turn on the surface of p type silicon substrate 1. Then, through insulating film 45 and polycrystalline silicon film 44, p type impurity such as boron (B) is introduced into a deep position in p type silicon substrate 1 to form first impurity concentration peak position 46a.

Then, referring to FIG. 39, resist 47 is applied on polycrystalline silicon film 44, and resist 47 is patterned to leave resist 47 at a portion positioned on the element isolation region. Then, using resist 47 as mask, polycrystalline silicon film 44 and insulating film 45 are etched. Thus, the surface of p type silicon substrate 1 positioned on the element formation region is exposed.

Then, referring to FIG. 40, through resist 47 patterned in the above-described manner, polycrystalline silicon film 44 and insulating film 45, p type impurity such as boron (B) is introduced into p type silicon substrate 1 in the vicinity of the bottom surface of insulating film 45. Thus, at the same time, the impurity is introduced into a deep position under the element formation region. Thus, second impurity concentration peak position 46b is formed. In the case of this embodiment, controlling the thickness of resist 47 can control the depth of second impurity concentration peak position 46b under the element formation region. Forming second impurity concentration peak position 46b at the deep position as described above can suppress the substrate biasing effect to a small level. Furthermore, as in the case of the foregoing embodiments, the narrow channel effect can be suppressed as well.

Figure 41:
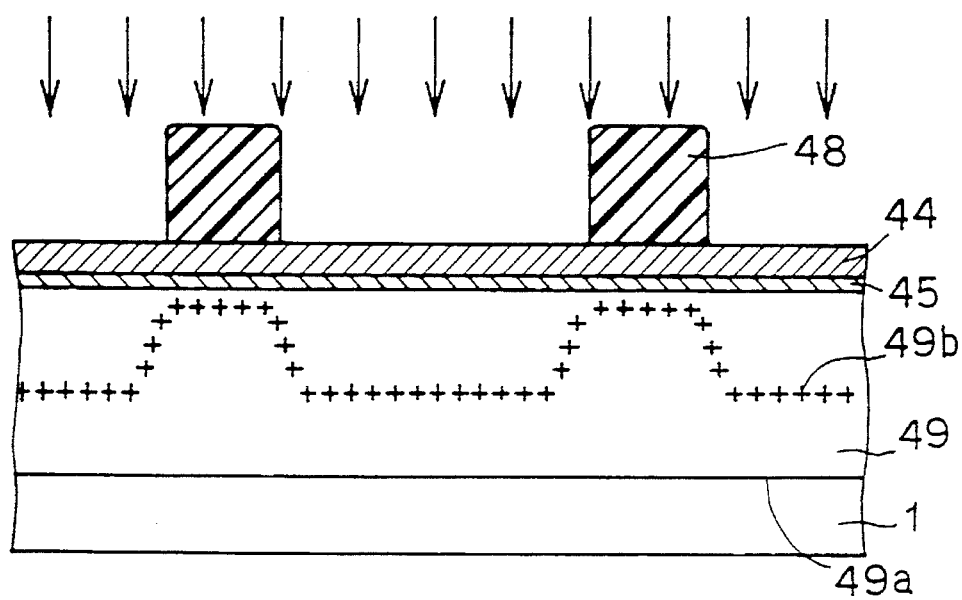
FIGS. 41–42 are partial cross sectional views showing 2nd–3rd steps in a method of manufacturing a semiconductor device according to a tenth embodiment of the invention.
Figure 42:
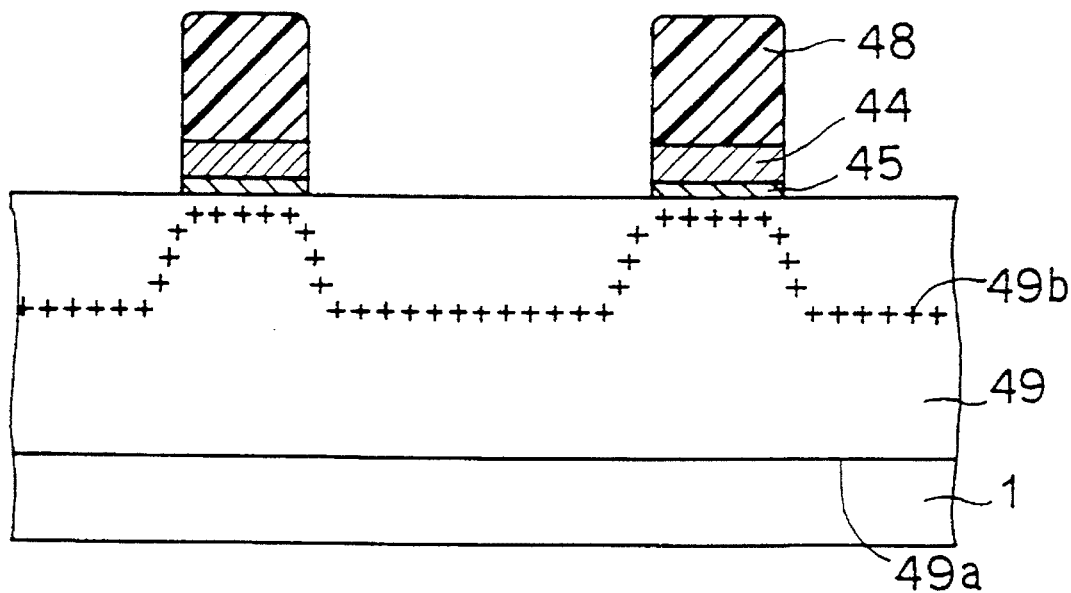
Figure 43:
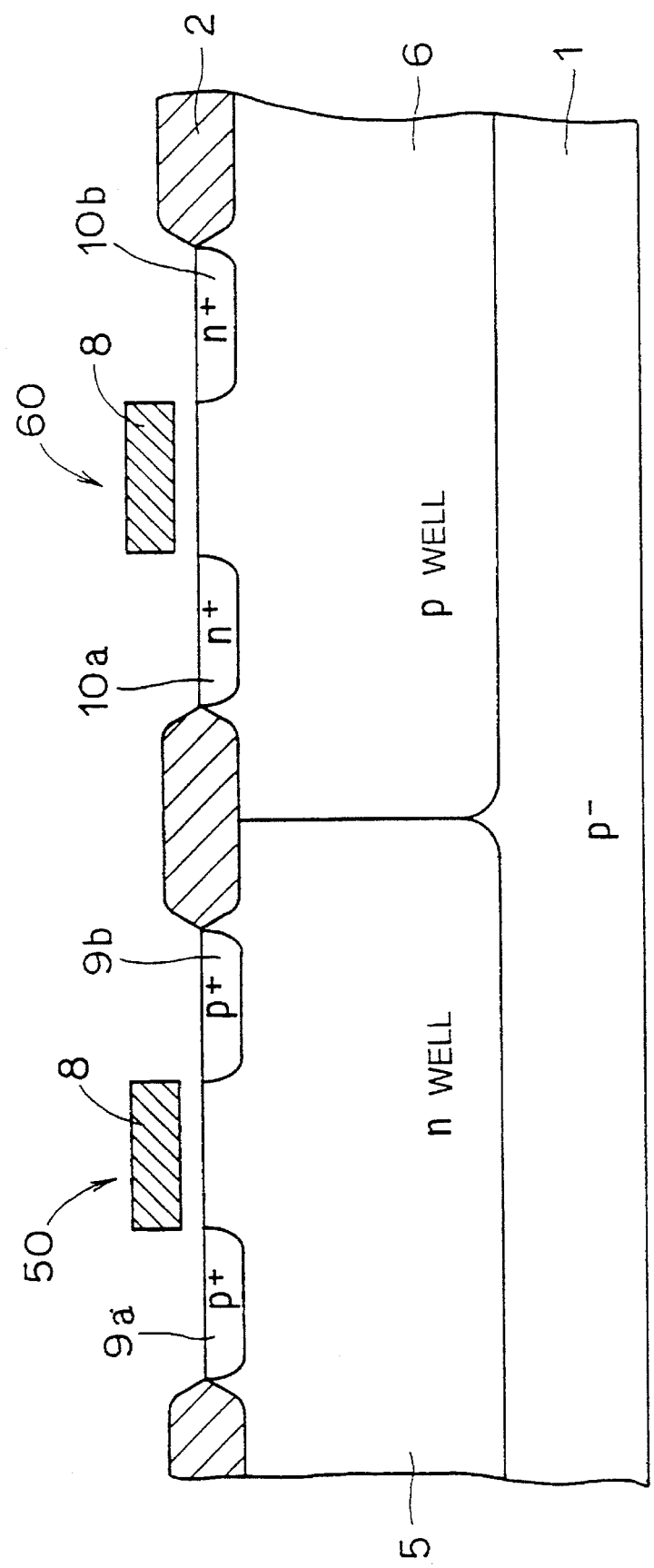
FIG. 43 is a partial cross sectional view showing the structure of a conventional CMOS transistor.
Figure 44:
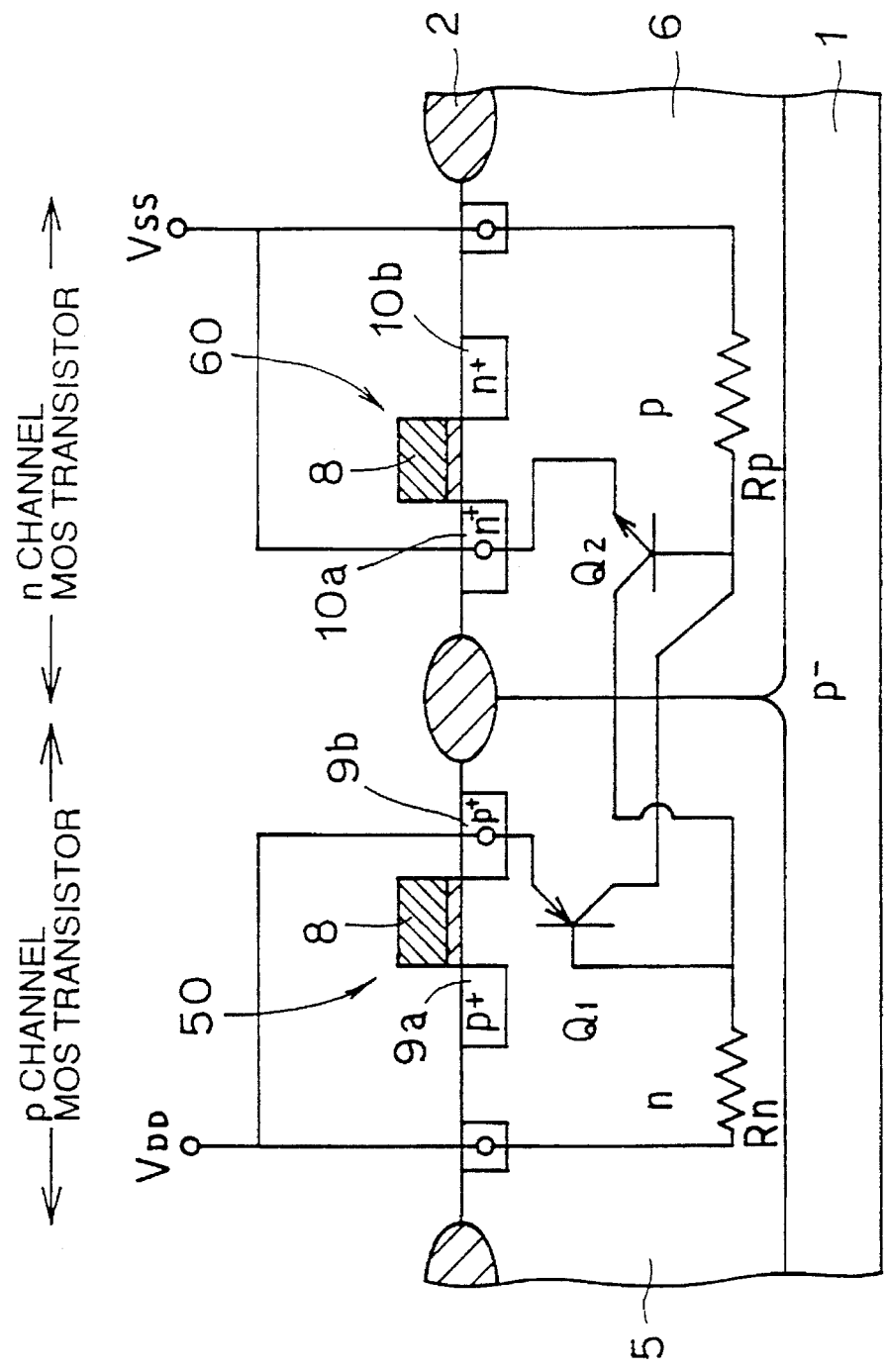
FIG. 44 is a partial cross sectional view schematically showing one example of a parasitic thyristor formed in a conventional CMOS transistor.
Figure 45:
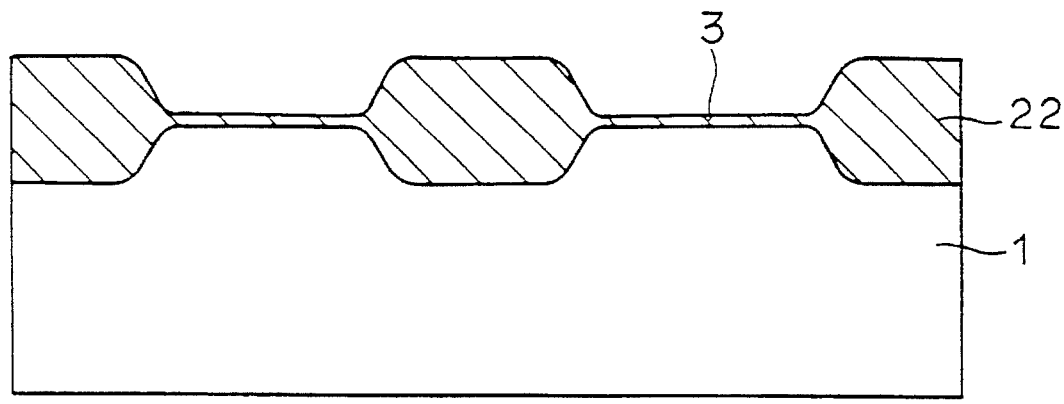
FIGS. 45–49 are partial cross sectional views showing 1st–5th steps in a method of manufacturing a conventional semiconductor device.
Figure 46:
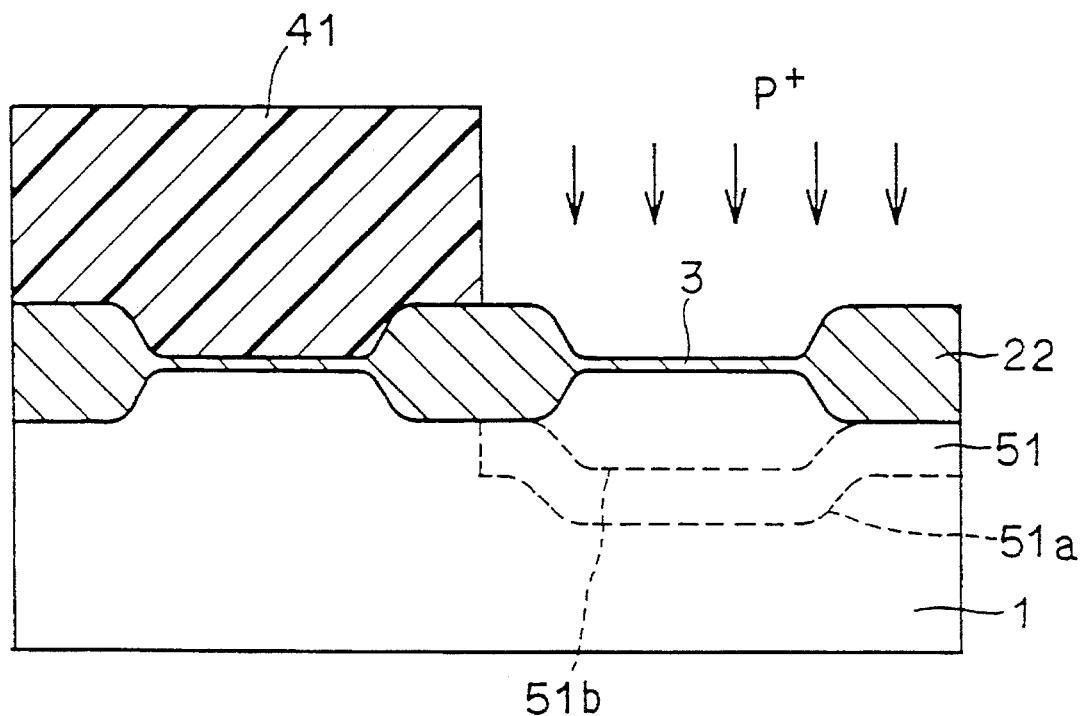
Figure 47:
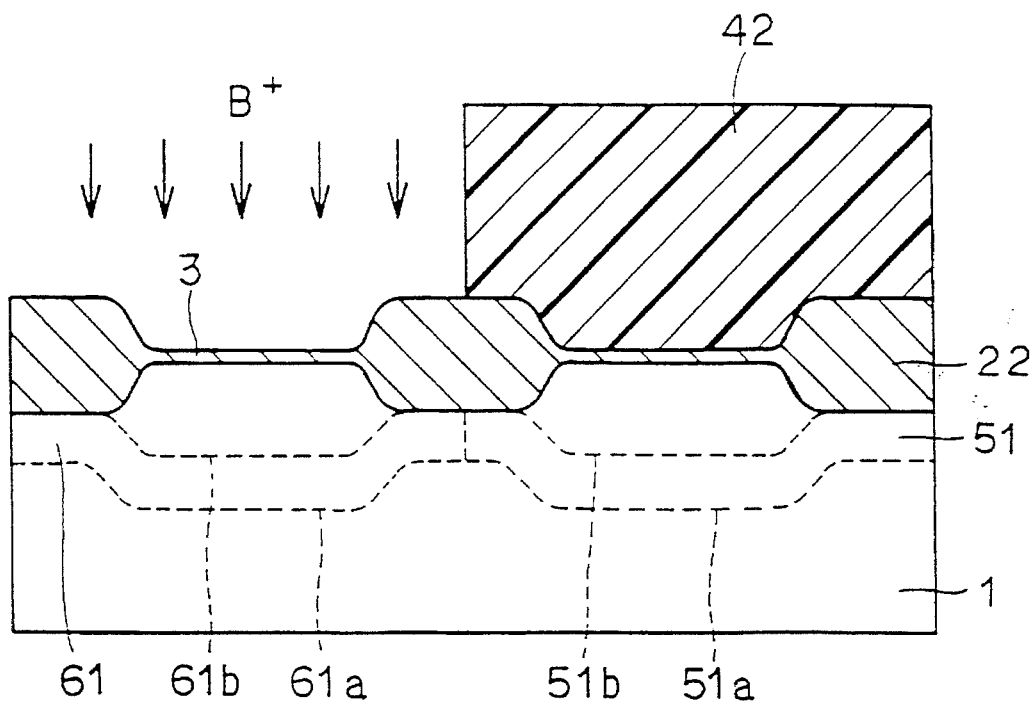
Figure 48:
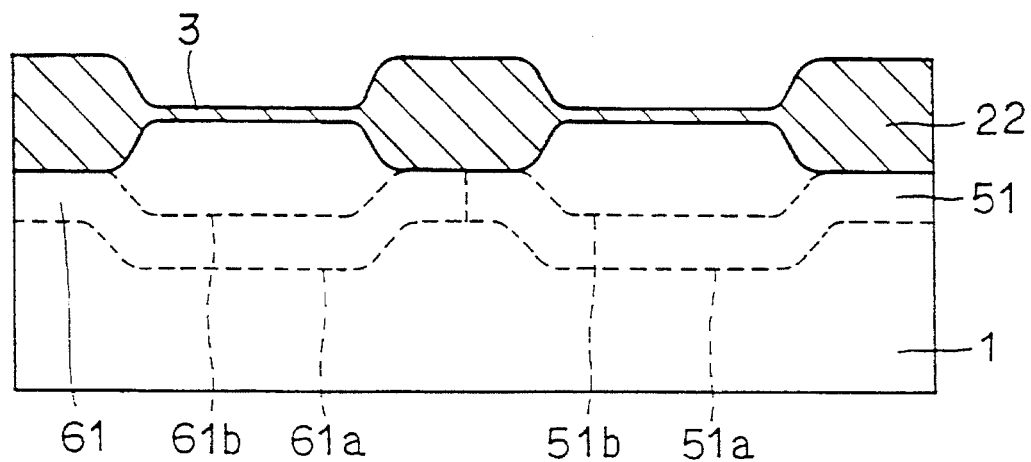
Figure 49:
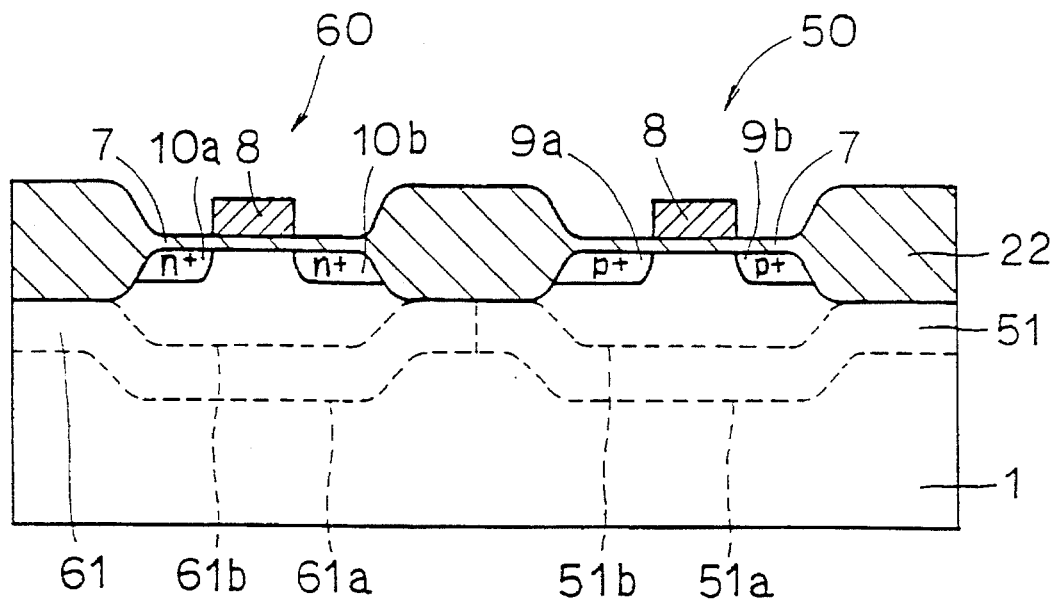
Figure 50:
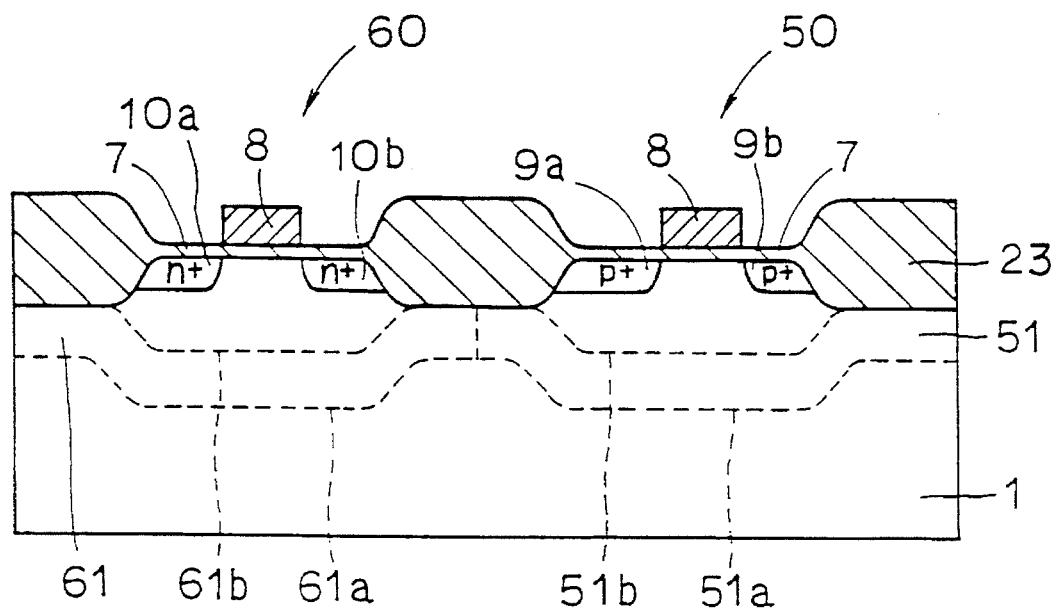
FIG. 50 is a partial cross sectional view showing a conventional semiconductor device when the thickness of an isolation insulating film is reduced with reduction of the size of elements.
Figure 51:
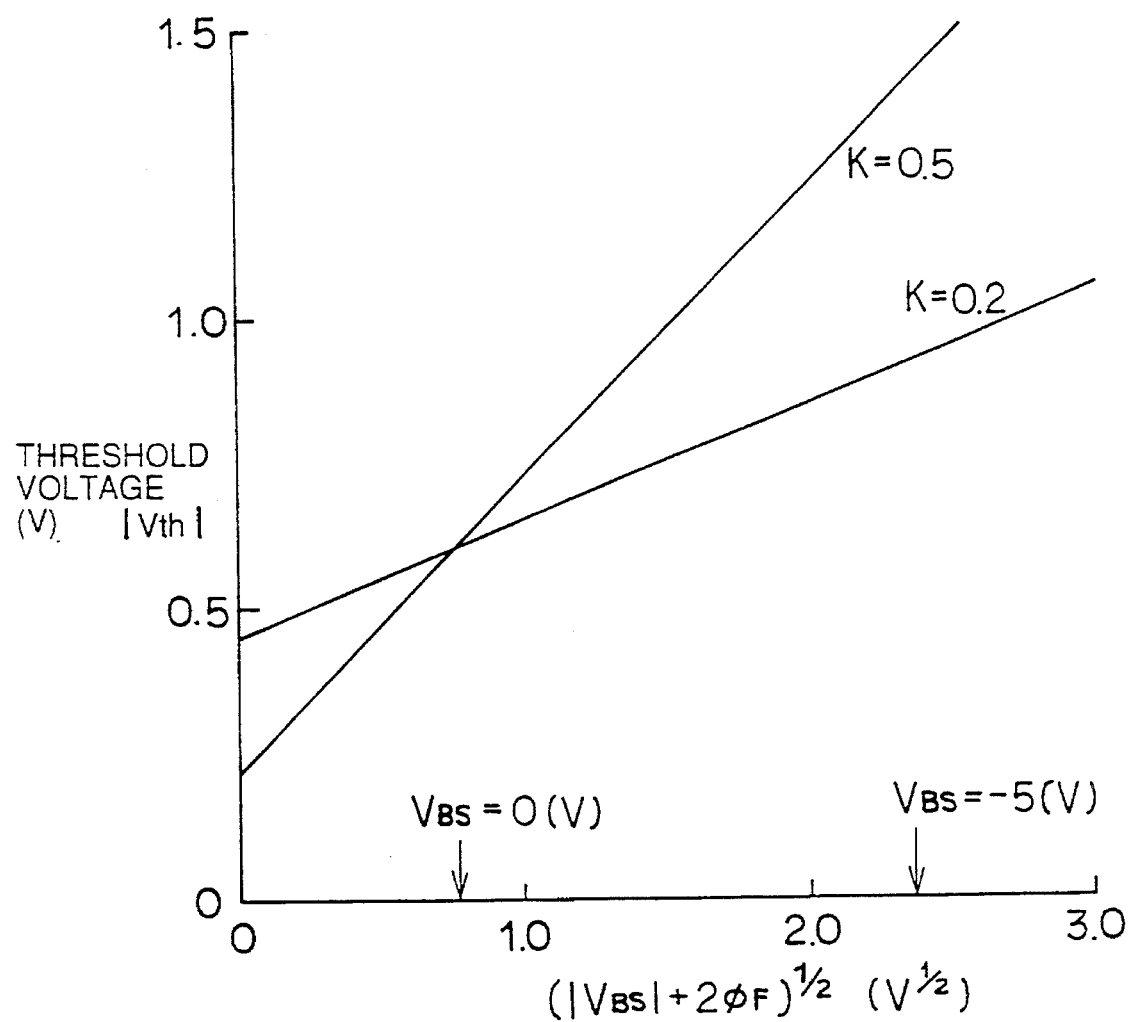
FIG. 51 is a graph showing the relation between threshold voltage and substrate bias voltage.
Figure 52:
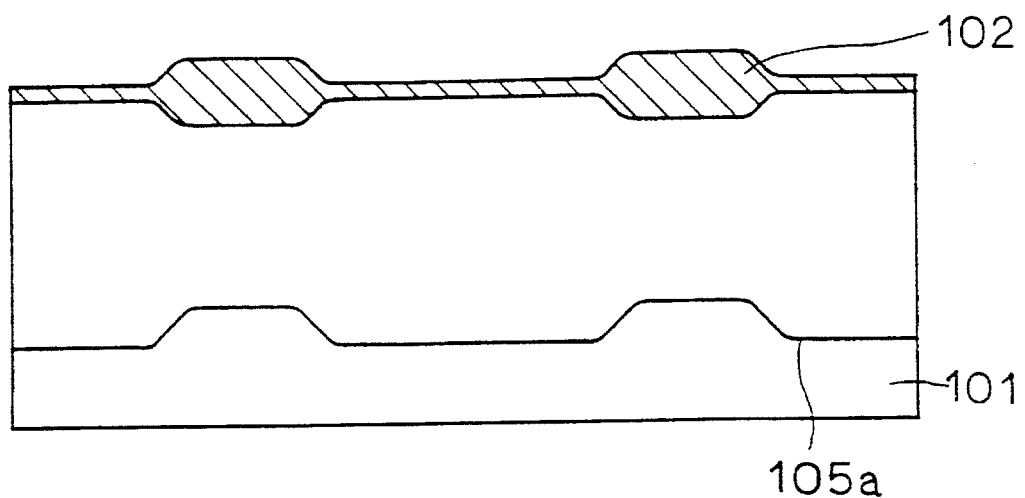
FIGS. 52–54 are partial cross sectional views showing 1st–3rd steps in a method of manufacturing a semiconductor device having a conventional retrograde well structure.
Figure 53:
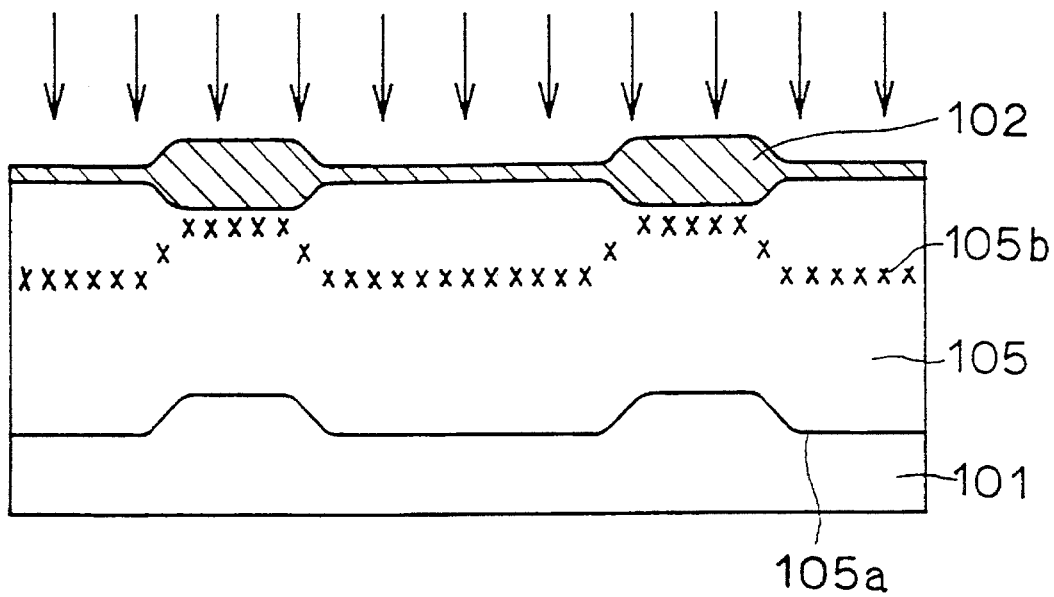
Figure 54:
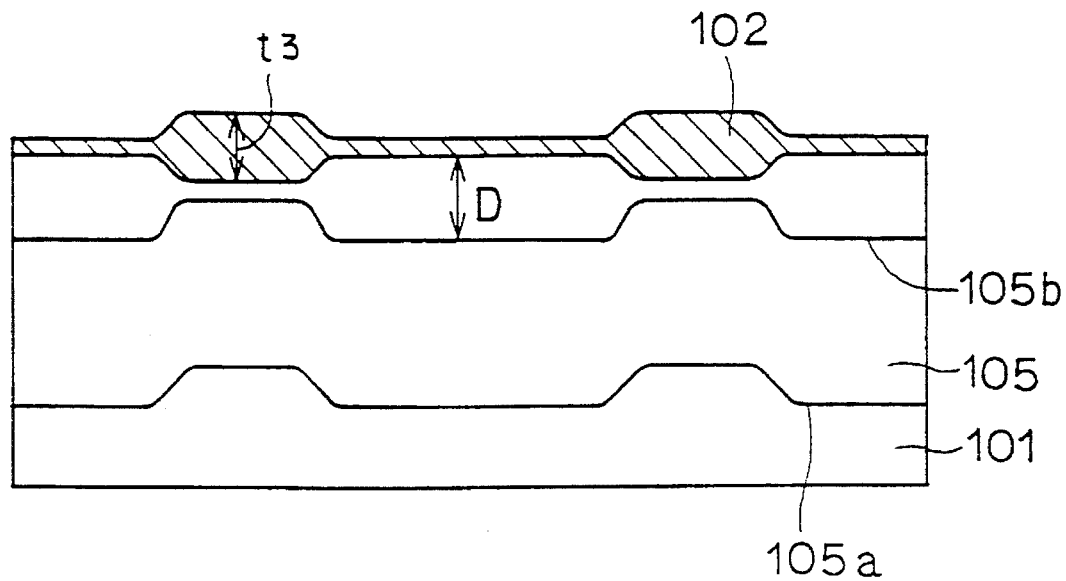
Figure 55:
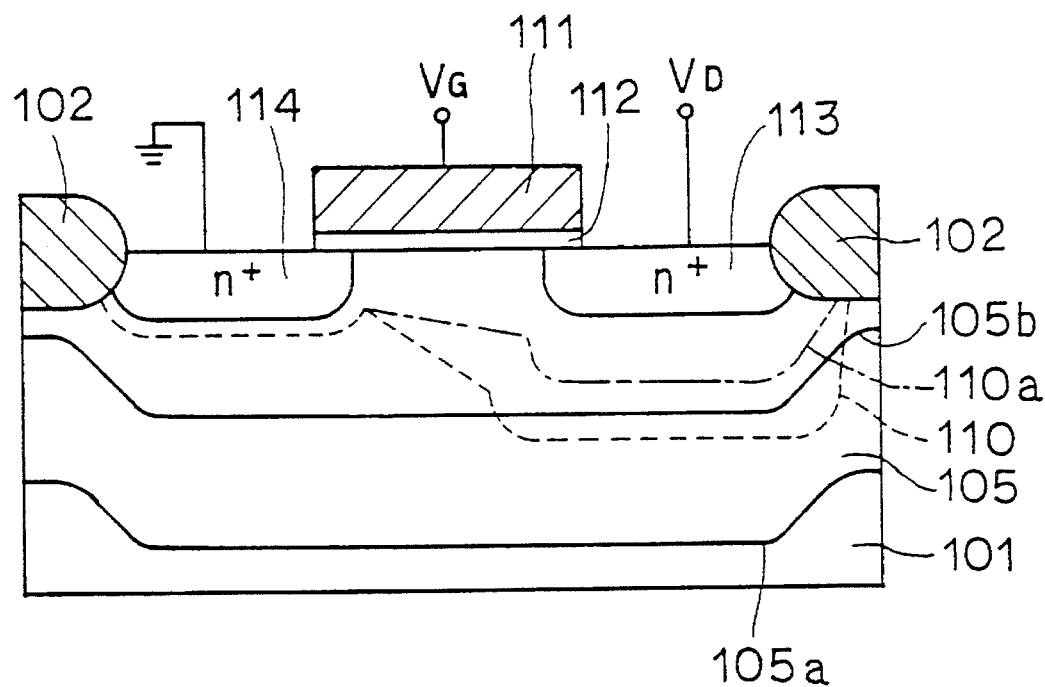
FIG. 55 is a view for use in illustration of the influence of a conventional retrograde well structure upon substrate biasing in effect.
Figure 56:
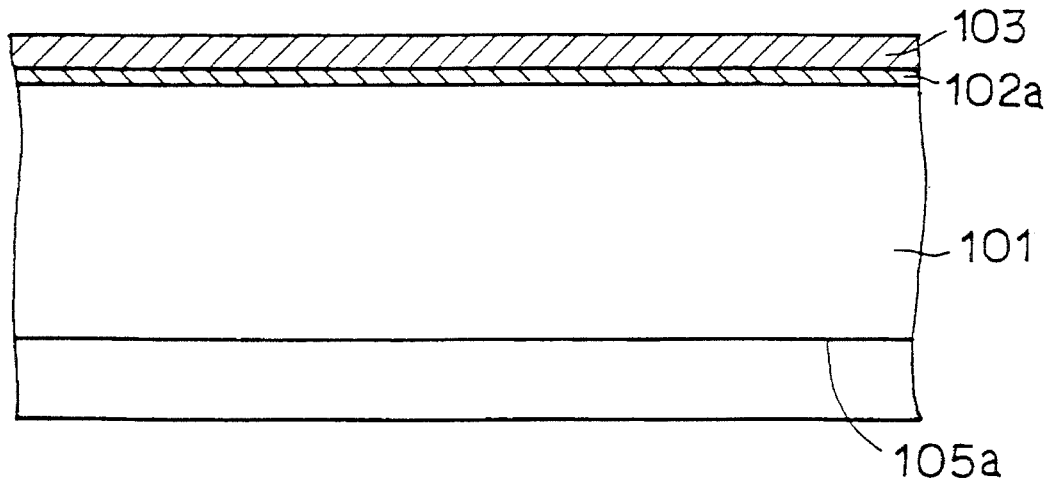
FIGS. 56–60 are partial cross sectional views showing 1st–5th steps in a process of forming an element isolation structure by conventional LOCOS.
Figure 57:
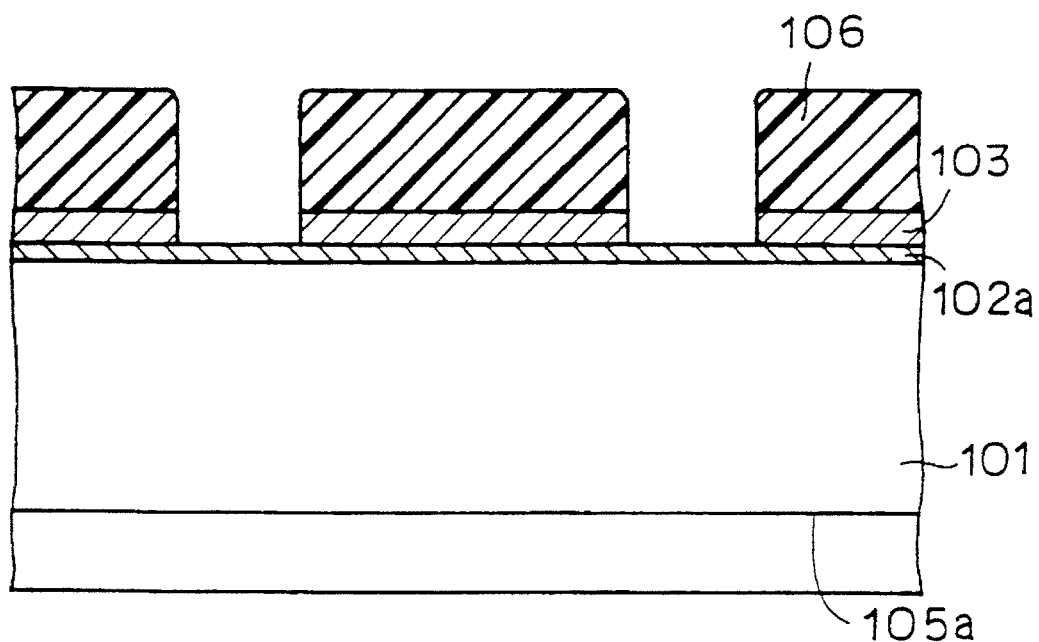
Figure 58:
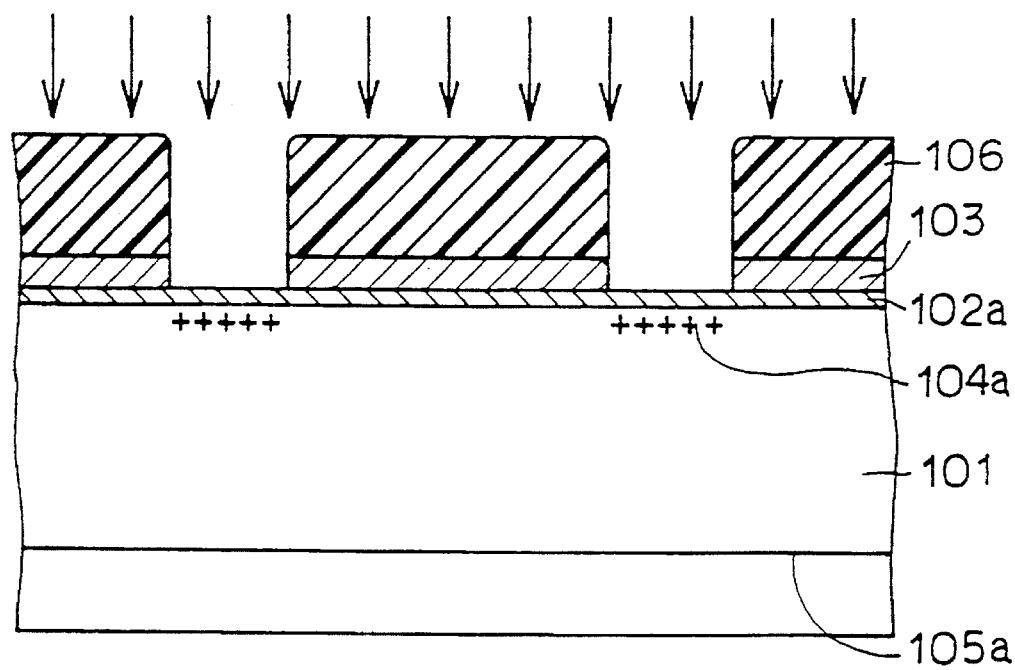
Figure 59:
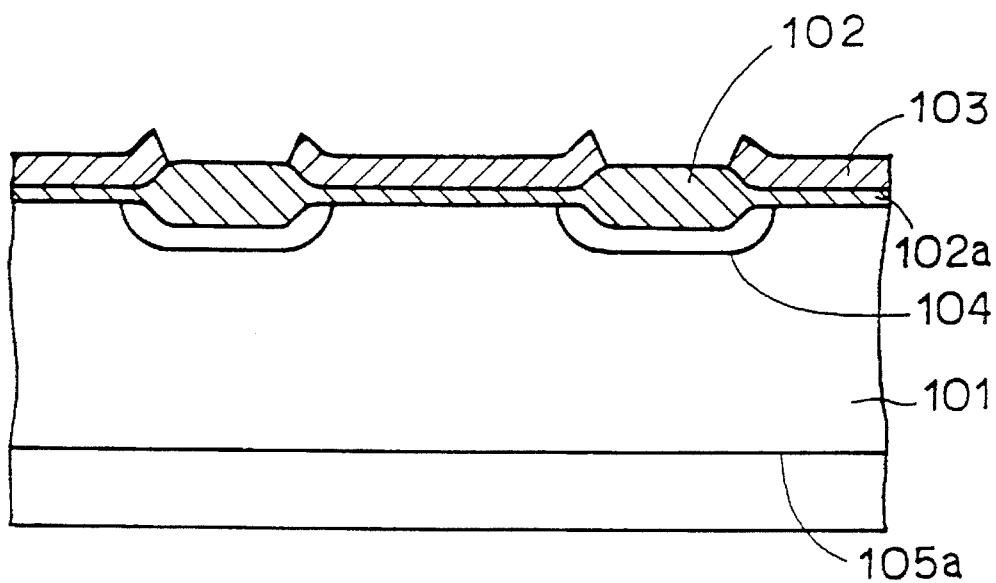
Figure 60:
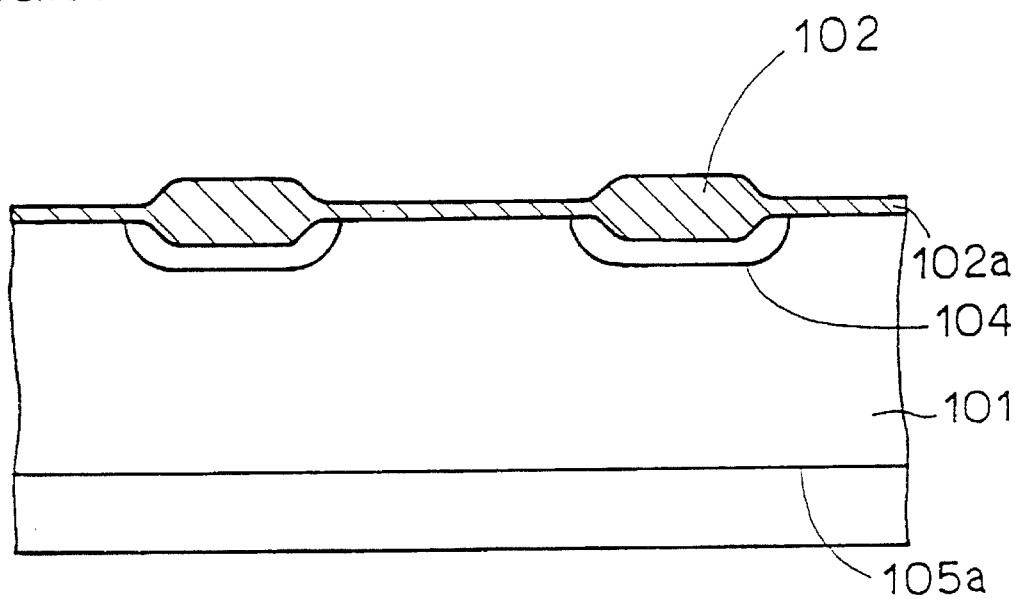
Figure 61:
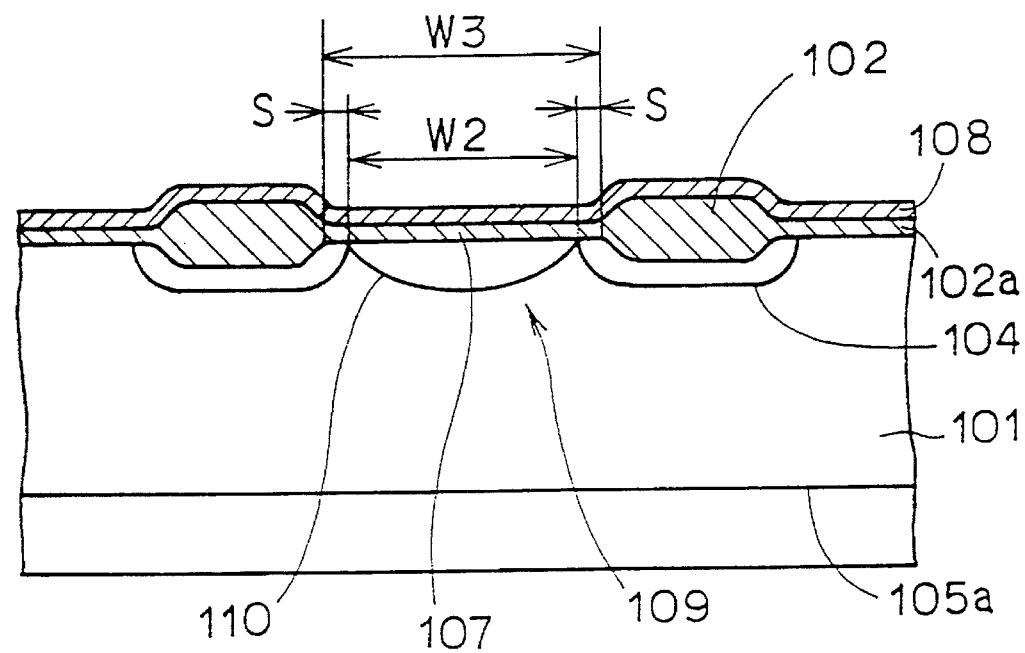
FIG. 61 is a view for use in illustration of a problem when an MOS transistor is formed into the element isolation structure shown in FIG. 60.
Figure 62:
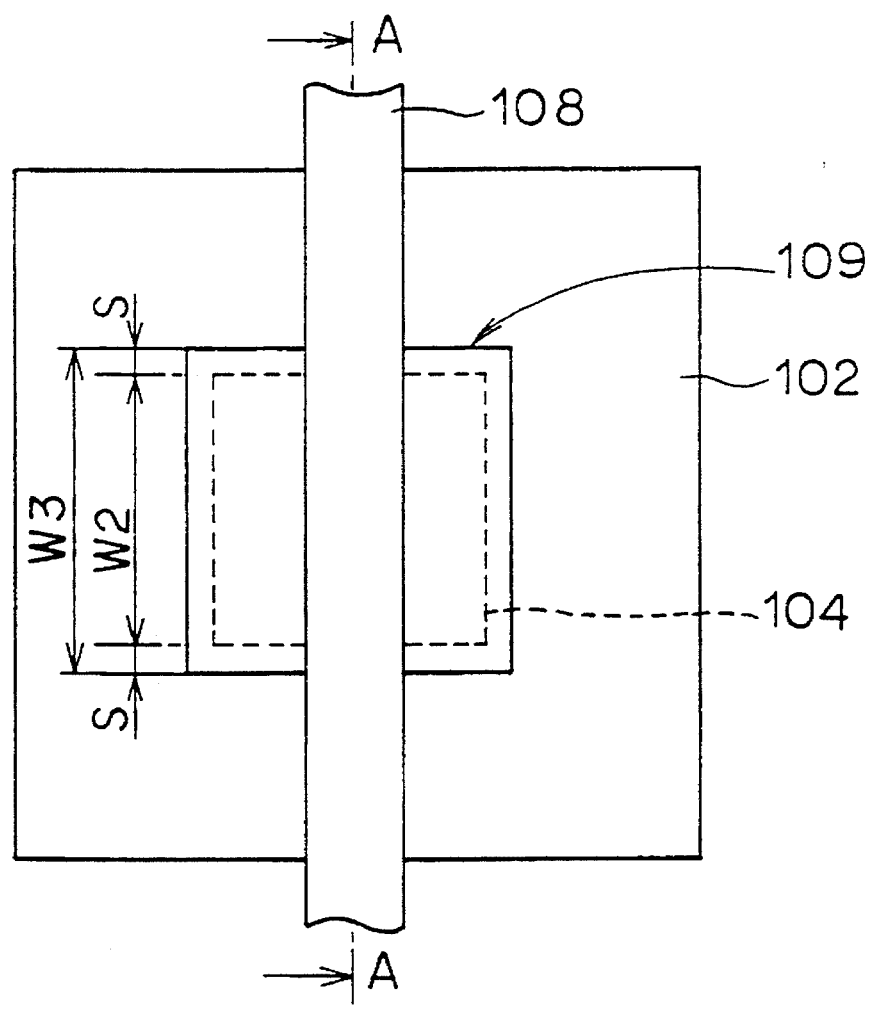
FIG. 62 is a plan view showing an MOS transistor shown in FIG. 61.

Now, referring to FIGS. 41 and 42, the tenth embodiment of the invention will be described. FIGS. 41 and 42 are cross sectional views showing steps of manufacturing a semiconductor device according to the tenth embodiment of the invention.

Going through the same steps as in the ninth embodiment described above, insulating film 45 and polycrystalline silicon film 44 are formed on p type silicon substrate 1, and a first impurity concentration peak position 49a is formed in p type silicon substrate 1. Then, referring to FIG. 41, resist 48 having a prescribed thickness is deposited on polycrystalline silicon film 44, and resist 48 is patterned to leave resist 48 only on the element isolation region. p type impurity ions are implanted with such energy to penetrate resist 48, polycrystalline silicon film 44 and insulating film 45 to form second impurity concentration peak position 49b. Thus, second impurity concentration peak position 49a is formed at a deep position under the element formation region. Thus, the substrate biasing effect can be suppressed to a small level.

Furthermore, at the time, since the surface of p type silicon substrate 1 is not exposed, as in the case of the eighth embodiment, contamination with a metal or the like at the time of ion implantation can be restricted. Then, as illustrated in FIG. 42, using resist 48 as mask, polycrystalline silicon film 44 and insulating film 45 are etched. Then, resist 48 is removed away. Thus, the impurity which functions as a channel cut layer is introduced into the vicinity of the bottom surface of oxide film 45, and at the same time, the impurity is introduced into a deep position from the surface of p type silicon substrate 1 in the element formation region. Thus, as in the case of the foregoing embodiments, the narrow channel effect as well as the substrate biasing effect can be restricted to a small level.

As the foregoing, according to the invention, in one aspect, the thickness and extending portion of the isolation insulating film can be reduced and the element formation region can be expanded, which is advantageous for reducing the size of a semiconductor device. Since a retrograde well structure is formed at a deep position from the surface of the substrate in the element formation region, which is suitable for reducing the size of a semiconductor device and the substrate biasing effect can be suppressed. Stated differently, a method of forming a retrograde well structure applicable to a semiconductor device whose size is reduced is provided.

According to the invention, in another aspect, the first impurity region is formed only in the vicinity of the bottom surface of the isolation insulating film, and the second impurity region is formed in a separate step. Thus, the second impurity region can be formed at a deep position from the surface of the semiconductor substrate by appropriately selecting conditions for forming thereof. Thus, the substrate biasing effect can be kept at a small level. Meanwhile, the first impurity region can be formed only in the region position under the isolation insulating film, and therefore the narrow channel effect can be suppressed.

According to the invention in a still further aspect, the mask layer is formed on the element isolation layer and an impurity is introduced into the semiconductor substrate through the element isolation layer and mask layer. Thus, the impurity is also introduced into the semiconductor substrate in the vicinity of the lower surface of the element isolation layer. Since the impurity is introduced into the element formation region in which the element isolation layer and mask layer are not formed, the impurity is introduced into a deep position in the semiconductor substrate in the region. Thus, the substrate biasing effect can be suppressed. Furthermore, in the region other than the region in which the element isolation layer is formed, the impurity is introduced from the vicinity of the bottom surface of the element isolation layer to a deep position under the element formation region. Thus, the narrow channel effect can be suppressed. Furthermore, appropriately adjusting the thickness of the mask layer permits adjustment of the depth of the second region. Thus, the depth of the second region can be adjusted to an optimum depth for each device.

According to the invention, in a still further aspect, the impurity is introduced into the first region in the element isolation region, and the isolation insulating film is formed in the second region including and surrounding the first region. At the time, the area of the first region is selected, estimating the amount of diffusion of the impurity due to the formation of the isolation insulating film. The first impurity region can therefore be formed to exist only in the region under the isolation insulating film. Thus, the narrow channel effect can be suppressed. Meanwhile, the second impurity region is formed in a separate step from the first impurity region. Accordingly, forming the second impurity region at a deep position in the semiconductor substrate permits the substrate biasing effect to be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

selectively forming an isolation insulating film having a thickness on a main surface of a semiconductor substrate to isolate an element formation region;

implanting an impurity into a region of said semiconductor substrate from above the main surface of said semiconductor substrate through said isolation insulating film, thereby forming a well region having an impurity concentration distribution in the region of said semiconductor substrate positioned under said isolation insulating film; and removing a surface portion of said isolation insulating film after forming said well region so that the top surface of the peripheral portion of the isolation insulating film is positioned below the main surface of the semiconductor substrate.

2. A method of manufacturing a semiconductor device as recited in claim 1, wherein said step of forming said isolation insulating film includes a step of forming an oxide film by a LOCOS process.

3. A method of manufacturing a semiconductor device as recited in claim 1, wherein said step of forming said well region includes the steps of:

implanting said impurity into said semiconductor substrate with a first energy; and implanting said impurity into said semiconductor substrate with a second energy higher than said first energy.

4. A method of manufacturing a semiconductor device as recited in claim 1, wherein said step of removing the surface portion of said isolation insulating film includes etching said surface portion of said isolation insulating film.

5. A method of manufacturing a semiconductor memory device including a memory cell array region and a peripheral circuit region, comprising the steps of:

selectively forming on a main surface of a semiconductor substrate an isolation insulating film having a thickness to isolate an element formation region included in said memory cell array region and said peripheral circuit region;

implanting an impurity into a region of said semiconductor substrate from above the main surface of said semiconductor substrate through said isolation insulating film, thereby forming a well region having an impurity concentration distribution in the region of said semiconductor substrate positioned under said isolation insulating film; and subsequently selectively removing the surface portion of the isolation insulating film positioned in said memory cell array region so that the thickness of the isolation insulating film in said memory cell array region is reduced.

6. A method of manufacturing a semiconductor device, comprising the steps of:

selectively forming on a main surface of a semiconductor substrate an isolation insulating film to isolate an element formation region;

forming a mask layer to expose a surface of said isolation insulating film;

implanting an impurity, in a first implanting step, through said exposed isolation insulating film, thereby forming a first impurity region in a region in said semiconductor substrate;

implanting a second impurity, in a second implantation step at a greater implantation energy than the first implantation step, in a region at a greater distance from the surface of said semiconductor substrate than said first impurity region from above the main surface of said semiconductor substrate; and removing a surface portion of said isolation insulating film after forming said well region so that the top surface of the peripheral portion of the isolation insulating film is positioned below the main surface of the semiconductor substrate.

7. A method of manufacturing a semiconductor device, comprising the steps of:

selectively forming on a main surface of a semiconductor substrate an isolation insulating film to isolate an element formation region;

forming a mask layer to expose a surface of said isolation insulating film;

implanting an impurity, in a first implanting step, through said exposed isolation insulating film, thereby forming a first impurity region in a region in said semiconductor substrate; and implanting a second impurity, in a second implantation step at a greater implantation energy than the first implantation step, in a region at a greater distance from the surface of said semiconductor substrate than said first impurity region from above the main surface of said semiconductor substrate, wherein said first impurity region has a first impurity concentration peak portion, said second impurity region has a second impurity concentration peak portion, and a third impurity concentration peak portion under the second impurity concentration peak portion, and said first impurity concentration peak portion and said second impurity concentration peak portion are formed individually without a shared portion.

8. A method of manufacturing a semiconductor device as recited in claim 6, wherein said first impurity region is a channel cut layer, and said second impurity region includes a retrograde well.

9. A method of manufacturing a semiconductor device as recited in claim 6, wherein said first impurity region is formed to be positioned only in a region under said isolation insulating film.

10. A method of manufacturing a semiconductor device as recited in claim 6, wherein said mask layer is formed to cover the periphery of said isolation insulating film.

11. A method of manufacturing a semiconductor device as recited in claim 6, wherein the position to form said second impurity region is selected independently of said first impurity region.

12. A method of manufacturing a semiconductor device, comprising the steps of:

selectively forming on a main surface of a semiconductor substrate an element isolation layer to isolate an element formation region;

forming on said element isolation layer a mask layer to expose a surface of said element formation region;

conducting two separate impurity implantations through said mask layer and said element isolation layer, thereby forming an impurity region extending from a first region in said semiconductor substrate to a second region at a greater distance from the surface of said semiconductor substrate than the first region.

13. A method of manufacturing a semiconductor device as recited in claim 12, wherein said element isolation layer includes an isolation insulating film.

14. A method of manufacturing a semiconductor device, comprising the steps of:

selectively forming on a main surface of a semiconductor substrate an element isolation layer to isolate an element formation region;

forming on said element isolation layer a mask layer to expose a surface of said element formation region;

implanting an impurity through said mask layer and said element isolation layer, thereby forming an impurity region extending from a first region in said semiconductor substrate to a second region at a greater distance from the surface of said semiconductor substrate than the first region; wherein said mask layer is formed to cover the entire upper surface of said element isolation layer.

15. A method of manufacturing a semiconductor device as recited in claim 12, wherein said impurity region has a first impurity concentration peak portion, and a second impurity concentration peak portion positioned under the first impurity concentration peak portion, and the position of said first impurity concentration peak portion under said element formation region is determined by the thickness of said mask layer.

16. A method of manufacturing a semiconductor device as recited in claim 12, wherein said impurity region has a first impurity concentration peak portion, and a second impurity concentration peak portion positioned under the first impurity concentration peak portion, and the distance between said first and second impurity concentration peak portions positioned under said isolation insulating film is larger than the distance between said first and second impurity concentration peak portions positioned under said element formation region.

17. A method of manufacturing a semiconductor device as recited in claim 12, wherein said mask layer constitutes a part of said element isolation layer.

18. A method of manufacturing a semiconductor device as recited in claim 17, wherein said mask layer is an oxide film.

19. A method of manufacturing a semiconductor device as recited in claim 17, wherein said mask layer is a TEOS (Tetra Ethyl Ortho Silicate) film.

20. A method of manufacturing a semiconductor device as recited in claim 17, wherein said mask layer is a nitride film.

21. A method of manufacturing a semiconductor device as recited in claim 17, wherein said step of forming the mask layer includes the steps of:

forming a TEOS film on the entire main surface of said semiconductor substrate using a chemical vapor deposition process;

forming a patterned resist on said TEOS film at a portion positioned on said element isolation layer;

performing etching using said patterned resist as a mask, thereby leaving said TEOS film on said element isolation layer; and removing said patterned resist.

22. A method of manufacturing a semiconductor device as recited in claim 17, wherein said step of forming the mask layer includes the steps of:

forming a nitride film on the entire main surface of said semiconductor substrate using a chemical vapor deposition process;

forming a patterned resist on said nitride film at a portion positioned on said element isolation layer;

performing etching using said patterned resist as a mask, thereby leaving said nitride film on said element isolation layer; and removing said patterned resist.

23. A method of manufacturing a semiconductor device as recited in claim 12, further comprising a step of removing said mask layer.

24. A method of manufacturing a semiconductor device as recited in claim 12, wherein said step of forming the element isolation layer includes the steps of:

forming on said main surface of said semiconductor substrate an oxide film having a thickness by CVD; and patterning said oxide film, thereby leaving said oxide film in the element isolation region.

25. A method of manufacturing a semiconductor device as recited in claim 24, wherein said oxide film is formed on the entire main surface of said semiconductor substrate by thermal oxidation.

26. A method of manufacturing a semiconductor device as recited in claim 24, wherein said impurity region has a first impurity concentration peak portion, and a second impurity concentration peak portion under the first impurity concentration peak portion, and said first impurity concentration peak portion is formed after said oxide film is patterned.

27. A method of manufacturing a semiconductor device, comprising the steps of:

selectively forming on a main surface of a semiconductor substrate an element isolation layer to isolate an element formation region;

forming on said element isolation layer a mask layer to expose a surface of said element formation region;

implanting an impurity through said mask layer and said element isolation layer, thereby forming an impurity region extending from a first region in said semiconductor substrate to a second region at a greater distance from the surface of said semiconductor substrate than the first region; wherein said step of forming the element isolation layer includes the steps of:

forming on said main surface of said semiconductor substrate an oxide film having a thickness by CVD; and patterning said oxide film, thereby leaving said oxide film in the element isolation region, and wherein said impurity region has a first impurity concentration peak portion, and a second impurity concentration peak portion under the first impurity concentration peak portion, said first impurity concentration peak portion is formed by implanting said impurity through said oxide film and said mask layer before said oxide film is patterned, and then said oxide film is patterned using said mask layer as a mask.

28. A method of manufacturing a semiconductor device, comprising the steps of:

selectively forming on a main surface of a semiconductor substrate an element isolation layer to isolate an element formation region;

forming on said element isolation layer a mask layer to expose a surface of said element formation region;

implanting an impurity through said mask layer and said element isolation layer, thereby forming an impurity region extending from a first region in said semiconductor substrate to a second region at a greater distance from the surface of said semiconductor substrate than the first region, wherein said element isolation layer includes a stacked layer structure formed of an insulating layer formed on said semiconductor substrate and a conductive layer formed on the insulating layer.

29. A method of manufacturing a semiconductor device as recited in claim 28, wherein said conductive layer is a polycrystalline silicon layer.

30. A method of manufacturing a semiconductor device, comprising the steps of:

selectively forming on a main surface of a semiconductor substrate an element isolation layer to isolate an element formation region;

forming on said element isolation layer a mask layer to expose a surface of said element formation region;

implanting an impurity through said mask layer and said element isolation layer, thereby forming an impurity region extending from a first region in said semiconductor substrate to a second region at a greater distance from the surface of said semiconductor substrate than the first region, wherein an insulating layer and a conductive layer constituting said element isolation layer are formed in turn on the entire main surface of said semiconductor substrate, a mask layer is patterned on said conductive layer, and said element isolation layer is left on the element isolation region by performing etching using said mask layer as mask.

31. A method of manufacturing a semiconductor device as recited in claim 30, wherein said impurity region has a first impurity concentration peak portion and a second impurity concentration peak portion under the first impurity concentration peak portion, and said first impurity concentration peak portion is formed after said element isolation layer is patterned.

32. A method of manufacturing a semiconductor device as recited in claim 30, wherein said impurity region has a first impurity concentration peak portion and a second impurity concentration peak portion under the first impurity concentration peak portion, said first impurity concentration peak portion is formed by implanting said impurity through said insulating layer, said conductive layer, and said mask layer before said element isolation layer is patterned, and then said insulating layer and said conductive layer are patterned using said mask layer as mask.

33. A method of manufacturing a semiconductor device, comprising the steps of:

selectively implanting an impurity into a first region in an element isolation region of a semiconductor substrate;

forming on a main surface of said semiconductor substrate an isolation insulating film having a thickness in a second region including and surrounding said first region in said element isolation region, thereby forming a first impurity region in said first region; and forming a second impurity region from above the main surface of said semiconductor substrate in a region further away from the surface of said semiconductor substrate than said first impurity region.

34. A method of manufacturing a semiconductor device as recited in claim 33, wherein said step of implanting the impurity includes the steps of:

exposing said first region on said semiconductor substrate and forming a patterned resist; and implanting said impurity into said semiconductor substrate using said patterned resist as a mask.

35. A method of manufacturing a semiconductor device as recited in claim 33, wherein said isolation insulating film is an oxide film, and said isolation insulating film forming step includes steps of forming an insulating film, and a nitride film in turn on said main surface of said semiconductor substrate;

patterning said insulating film and said nitride film, thereby forming an opening to expose said second region in said insulating film and said nitride film; and forming said isolation insulating film in said second region by selective oxidation.

36. A method of manufacturing a semiconductor device as recited in claim 35, wherein conditions for said selective oxidation are selected so that said first impurity region is positioned only in the region under said isolation insulating film.

37. A method of manufacturing a semiconductor device as recited in claim 33, wherein a peripheral portion of said first region in the main surface of said semiconductor substrate, and a peripheral portion of said second region in the main surface of said semiconductor substrate are spaced apart from each other by a distance not greater than a maximum distance over which said impurity is diffused when said isolation insulating film is formed.

38. A method of manufacturing a semiconductor device as recited in claim 33, wherein said first impurity region is a channel cut layer, and said second impurity region includes a retrograde well.

39. A method of manufacturing a semiconductor device as recited in claim 33, wherein the position to form said second impurity region is selected independently of said first impurity region.

\* \* \* \* \*